US 8,607,186 B2

(12) United States Patent
Sripada et al.

(10) Patent No.: US 8,607,186 B2
(45) Date of Patent: Dec. 10, 2013

(54) AUTOMATIC VERIFICATION OF MERGED MODE CONSTRAINTS FOR ELECTRONIC CIRCUITS

(75) Inventors: Subramanyam Sripada, Hillsboro, OR (US); Sonia Singhal, Sunnyvale, CA (US); Cho Moon, San Diego, CA (US)

(73) Assignee: Synopsys, Inc., Mountain View, CA (US)

( * ) Notice: Subject to any disclaimer, the term of this patent is extended or adjusted under 35 U.S.C. 154(b) by 19 days.

(21) Appl. No.: 13/025,075

(22) Filed: Feb. 10, 2011

(65) Prior Publication Data

US 2011/0252390 A1    Oct. 13, 2011

Related U.S. Application Data

(63) Continuation-in-part of application No. 12/759,625, filed on Apr. 13, 2010, now Pat. No. 8,261,221, and a continuation of application No. 12/960,745, filed on Dec. 6, 2010.

(51) Int. Cl.
*G06F 17/50* (2006.01)
*G06F 9/455* (2006.01)

(52) U.S. Cl.
USPC ........... 716/136; 716/106; 716/107; 716/108; 716/113; 716/134; 703/13; 703/14

(58) Field of Classification Search
USPC .................. 716/106–108, 113, 134, 136; 703/13–14
See application file for complete search history.

(56) References Cited

U.S. PATENT DOCUMENTS

| | | | |
|---|---|---|---|
| 5,528,511 A | 6/1996 | Hasegawa | |
| 6,308,306 B1 | 10/2001 | Kaneko | |
| 6,487,705 B1 | 11/2002 | Roethig et al. | |
| 7,284,219 B1 | 10/2007 | Manaker, Jr. et al. | |
| 7,698,674 B2 | 4/2010 | Kalafala et al. | |
| 8,196,076 B2 | 6/2012 | Chander et al. | |
| 8,209,648 B1* | 6/2012 | Ku et al. | 716/108 |
| 2003/0229871 A1* | 12/2003 | Nakae et al. | 716/6 |
| 2004/0210861 A1 | 10/2004 | Kucukcakar et al. | |
| 2008/0301598 A1 | 12/2008 | Gangadharan et al. | |
| 2009/0132984 A1* | 5/2009 | Chander et al. | 716/6 |
| 2009/0326873 A1 | 12/2009 | Wang et al. | |

OTHER PUBLICATIONS

Gangadharan, S. et al., "Preserving the Intent of Timing Constraints", EDA Design Line, May 17, 2008, 9 pages, [Online] [Retrieved on Sep. 13, 2011] Retrieved from the Internet<URL:http://www.edadesignline.com/207800772?printableArticle=true>.

(Continued)

*Primary Examiner* — Nghia Doan
(74) *Attorney, Agent, or Firm* — Fenwick & West LLP

(57) ABSTRACT

Individual mode timing constraints associated with a set of netlists are combined into merged mode timing constraints. An initial merged mode constraint is generated by combining timing constraints from individual modes. The initial merged mode includes the union of all timing constraints from individual modes that add timing relationships and the intersection of all timing constraints from the individual modes that remove timing relationships. Extraneous timing relationships are identified in the merged mode and eliminated by introducing timing constraints in the merged mode. Equivalence between the merged mode and the individual modes is verified by comparing timing relationships in the merged mode with timing relationships in the individual modes. The merged mode is considered equivalent to the individual modes if every timing relationship present in an individual mode is present in the merged mode and every timing relationship present in the merged mode is present in any of individual modes.

17 Claims, 22 Drawing Sheets

(56) References Cited

OTHER PUBLICATIONS

PCT International Search Report and Written Opinion, PCT Application No. PCT/US2011/032268, Oct. 25, 2011, 9 pages.
Das, S.K. et al., "The Automatic Generation of Merged-Mode Design Constraints," Fishtail, Texas Instruments, Jul. 29, 2009, 15 pages.
United States Office Action, U.S. Appl. No. 12/960,745, Apr. 9, 2012, 15 pages.
United States Office Action, U.S. Appl. No. 12/759,625, Jan. 20, 2012, 15 pages.
United States Office Action, U.S. Appl. No. 13/328,572, Dec. 24, 2012, 13 pages.
United States Office Action, U.S. Appl. No. 12/960,745, Oct. 12, 2012, 18 pages.
United States Office Action, U.S. Appl. No. 12/960,745, Apr. 9, 2013, 21 pages.

* cited by examiner

AUTOMATIC VERIFICATION OF MERGED MODE CONSTRAINTS FOR ELECTRONIC CIRCUITS

CROSS REFERENCE TO RELATED APPLICATIONS

This application is a continuation-in-part of U.S. application Ser. No. 12/759,625, filed Apr. 13, 2010, and a continuation of U.S. application Ser. No. 12/960,745, filed on Dec. 6, 2010, each of which is incorporated by reference in its entirety.

FIELD OF THE INVENTION

This invention relates generally to electronic design automation (EDA) of circuits and in particular to automatic verification of merged mode constraints for electronic circuits.

BACKGROUND

Due to the large number of components in state of the art electronic circuits, most of their design and production is computer implemented. An important operation performed during design of electronic circuits is timing analysis that validates timing performance of an electronic design. One way to perform timing analysis is to use dynamic simulation which determines the full behavior of a circuit for a given set of input values. Timing analysis using dynamic simulation is highly computation intensive. A more efficient method for perform timing analysis validates timing performance of a circuit design by checking all possible paths for timing violations. This method is called static timing analysis (STA) and is much faster than dynamic simulation since it does not simulate the logical operation of the electronic circuit. However, performing static timing analysis for large electronic circuits can take significant time.

Furthermore, timing analysis needs to be repeated multiple times for the same electronic design for various combinations of modes and corners. Semiconductor device parameters can vary with conditions such as fabrication process, operating temperature, and power supply voltage. A circuit fabricated using these processes may run slower or faster than specified due to variations in operating conditions or may even fail to function. Therefore timing analysis is performed for various operating conditions to make sure that the circuit performs as specified under these conditions. Such operating conditions for a circuit are modeled using corners that comprise a set of libraries characterized for process, voltage, and temperature variations.

The timing analysis of a circuit is also repeated for different operating modes, for example, normal operating mode, test mode, scan mode, reset mode and so on. For example, a circuit used in a computer operates in a stand-by mode when the computer is in a stand-by mode. Similarly, during testing phase, a circuit may be operated in a test mode. A mode is modeled using a unique set of clocks, input voltages, and timing constraints in similar operating conditions.

For performing timing analysis during implementation and sign-off of a circuit, designers have to verify a large number of modes and corners. Each circuit design may have tens of modes and tens of corners. Since each mode has to be verified for each corner conditions, the total number of scenarios in which the design needs to be verified is the product of the number of modes and number of corners. This results in the timing analysis being performed a large number of times resulting in exorbitant costs.

One way to handle the large number of scenarios resulting from multiple modes and corners is to merge the modes into a smaller set, for example, a single mode. Since timing verification must be performed for the combination of modes and corners, reduction in the number of modes reduces the total combinations of modes and corners by a much larger number. For example, if there are 10 modes and 10 corners, the total number of combination of modes and corners is 10×10=100. However if the 10 modes were combined to a single mode, the total number of combinations is reduced to 1×10=10 which is a 90% reduction in the number of combinations that need to be verified.

Conventionally modes are merged manually by designers. Furthermore, the manually merged modes are manually verified against the original set of modes or not verified. Due to the complexity of constraints associated with circuit designs, the generation of merged modes is difficult to handle manually. Since the number of timing constraints for a given netlist can be large, manual merging of modes can be error prone and have prohibitive costs. For example, a circuit could have millions of lines of constraints and manually verifying correctness of merged constraints may not be practically feasible. Due to lack of confidence in the correctness of the merged modes, manually merged modes may be used during the implementation phase of the design but final sign-off of the design is performed using individual modes.

SUMMARY

The above and other issues are addressed by a computer-implemented method, computer system, and computer program product that verify equivalence of merged modes with respect to individual modes associated with a set of netlists. A source set of timing nodes and a sink set of timing nodes is identified for a given set of netlists. An aggregate set of timing relationships is obtained by traversing from the source set of timing nodes to the sink set of timing nodes for the merged mode and each individual mode. The timing relationships present in the aggregate set for the merged mode are compared with the timing relationships in the aggregate sets for individual modes. If a timing relationship is identified that is present in a merged mode but is not present in any individual mode, an error is reported. If a timing relationship is identified in any individual mode that is not present in the merged mode, an error is reported.

In one embodiment, the source set is the set of all start points and the sink set is an end point. The source set can be a start point and the sink set an end point. In an embodiment, the sink set can be a reconvergent point and the source set including a timing node on one of the timing nodes connected to the reconvergent node by an edge.

The features and advantages described in this summary and the following detailed description are not all-inclusive. Many additional features and advantages will be apparent to one of ordinary skill in the art in view of the drawings, specification, and claims hereof.

The Figures (FIGS.) and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures

DETAILED DESCRIPTION

Circuit designers perform static timing analysis of hundreds of combinations of modes and corners for implementation and sign-off of circuit designs. An electronic circuit can be represented as a circuit configuration comprising a description of the components of the circuit and the connections between the circuits specified as netlists and a representation of the timing constraints for the circuit. Each mode of a given circuit can be modeled as a set of timing constraints for the given set of netlists. Multiple modes can be merged into smaller set of modes, for example, a set of one mode to reduce the processing costs associated with timing analysis of the circuit design.

Embodiments generate merged modes and verify correctness of merged modes automatically. Automatic merging and verification of the merged modes gives high confidence in the correctness of the merged modes. As a result, the merged modes can be used for the implementation phase of the design as well as the final sign-off phase. Furthermore, automatic merging or verification of merged modes is less expensive and efficient to perform compared to manual processing.

Figure 1:
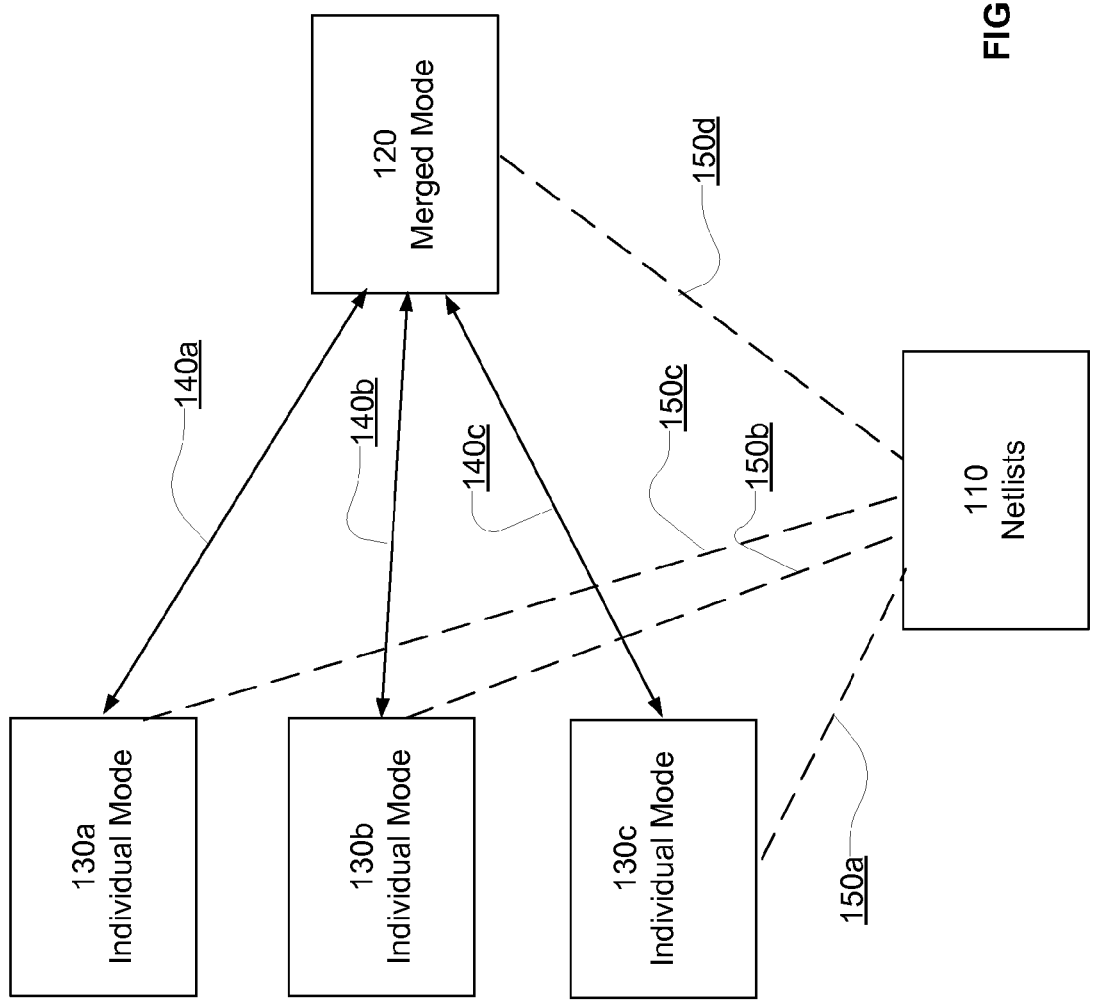
FIG. 1 illustrates a merged mode obtained from multiple individual modes for a given circuit configuration, in accordance with an embodiment.

FIG. 1 illustrates a merged mode obtained from multiple individual modes for a given circuit configuration. The individual modes 130 and the merged mode correspond to the set of netlists 110. (A letter after a reference numeral, such as "140a," indicates that the text refers specifically to the element having that particular reference numeral, while a reference numeral in the text without a following letter, such as "140," refers to any or all of the elements in the figures bearing that reference numeral.) Each mode 130, 120 represented in FIG. 1 corresponds to a set of timing constraints corresponding to the netlists 110. The association between the modes and the netlists is represented by the dotted lines 150. The merged mode 120 corresponds to a set of timing constraints that are equivalent to the individual modes 130 as represented by the arrows 140. There can be multiple merged modes 120 corresponding to the set of individual modes 130. The merged mode 120 can be defined manually. Embodiments automatically generate merged mode 120 based on the individual modes 130. Furthermore, embodiments perform automatic verification to determine if the merged mode 120 is equivalent to the individual modes 130.

Figure 2:
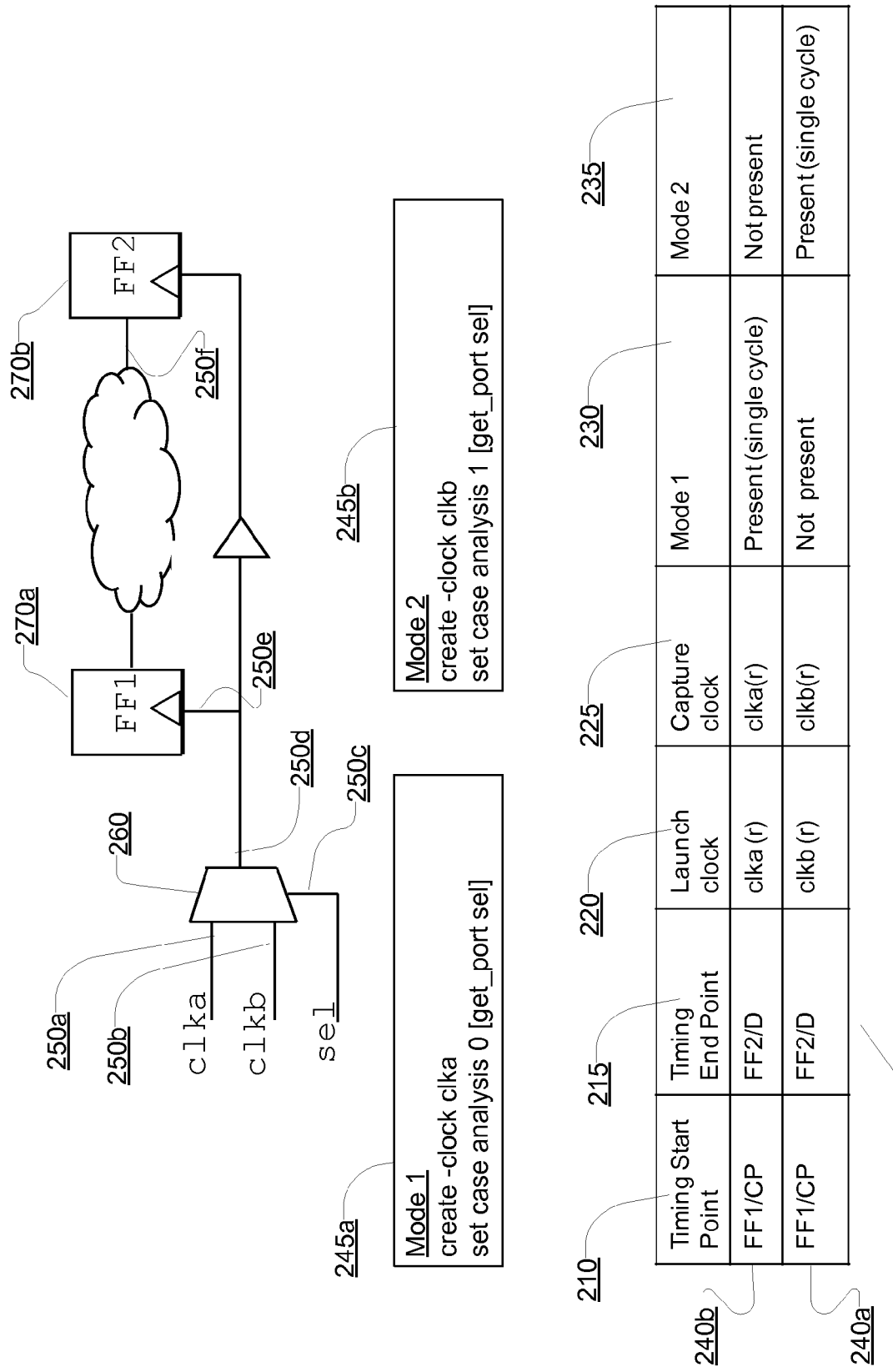
FIG. 2 illustrates timing relationships for a circuit associated with multiple modes, in accordance with an embodiment of the invention.

FIG. 2 illustrates timing relationships for a circuit associated with multiple modes. The circuit comprises various circuit elements including flip-flops 270a, 270b, a multiplexer 260, two clock inputs clka 250a and clkb 250b, a multiplexer select input signal 250c. There are two modes associated with the circuit, 245a and 245b. The mode 1 comprises a command for creating a clock clka 250a and a command for specifying the value of port 250c to be the constant 0. The mode 2 comprises a command for creating a clock clkb 250b and a command for specifying the value of port 250c to be the constant 1. The table 205 shows a structure for storing timing relations associated with the circuit. The timing relationships 240a and 240b comprise information including a timing start point 210, a timing end point 215, a launch clock 220, a capture clock 225, and information 230, 235 indicating whether the timing constraint is present in mode 1 and/or mode 2 respectively. The information stored in a timing relationship is not limited to the information illustrated in table 205 and may comprise other relevant information. Both timing relations 240a, 240b correspond to timing start point 250e (FF1/CP) and timing end point 250f (FF2/D). However the launch clock and the capture clock for timing 240a are both clkb(r), indicating the rising edge of clkb is used for both launch clock and capture clock for timing 240a. On the other hand, the launch clock and the capture clock for timing 240b are both clka(r), indicating the rising edge of clka is used for both launch clock and capture clock for timing 240b. Furthermore, the timing relationship 240b is present in mode 1 as a single cycle path as shown in column 230 but not present in mode 2 as shown in column 235. Similarly, the timing relationship 240a is not present in mode 1 as shown in column 230 but present in mode 2 as a single cycle path as shown in column 235.

Automatic generation and verification of merged constraints is based on comparison of timing relationships between merged mode and individual modes. A timing relationship is specified between a pair of timing nodes and comprises a launching clock, a capturing clock, and timing state, for example, multicycle path or false path between the start point and end point, a timing node specified as having a constant value etc. Adding a timing constraint to a circuit configuration may affect one or more timing relationships. For example, a timing constraint "set_max_delay—from A" applies to all paths that start from point A and may affect multiple timing relationships associated with point A. Some timing constraints may add new timing relationships, for example, timing constraints that add clocks to the circuit configuration. Some timing constraints can modify existing timing relationships, for example, a timing constraint that specifies a multicycle path can modify existing timing relationships by changing their timing state. Some timing constraints can eliminate timing relationship, for example, specifying false path between two timing nodes indicates that there is no timing relationship between the two timing nodes.

Automatic generation of merged mode is performed from individual modes for a netlist. An initial merged mode is generated by combining timing constraints from individual modes into the merged mode. The merged mode comprises an intersection set of all timing constraints of individual modes that remove timing relationships. The merged mode also comprises a union set of all timing constraints of individual modes that add or modify timing relationships. The merged mode comprises an intersection set of all timing constraints of individual modes that do not affect timing relationships. The timing relationships in the merged mode are compared with the timing relationships in the individual modes to identify extraneous timing relationships present in the merged mode. Timing constraints are added to the merged mode to eliminate the extraneous timing relationships.

Automatic verification of correctness of a merged mode with respect to individual modes is performed by comparing timing relationships present in the merged mode with the timing relationships present in the individual modes. Automatic verification of correctness of merged mode is performed by verifying that a timing relationship that exists in any individual mode is also present in the merged mode. Furthermore, the automatic verification process verifies that every timing relationship that exists in the merged mode is present in at least one of the individual modes. If there are timing relationships in the merged mode that do not occur in an individual mode or there are timing relationships in an individual mode that are not present in the merged mode, the merged mode does not correctly represent the timing constraint behavior of individual modes. Accordingly, such merged mode is not equivalent to the individual modes and a validation of the merged mode based on timing analysis does not guarantee validation of individual modes.

System Architecture

Figure 3:
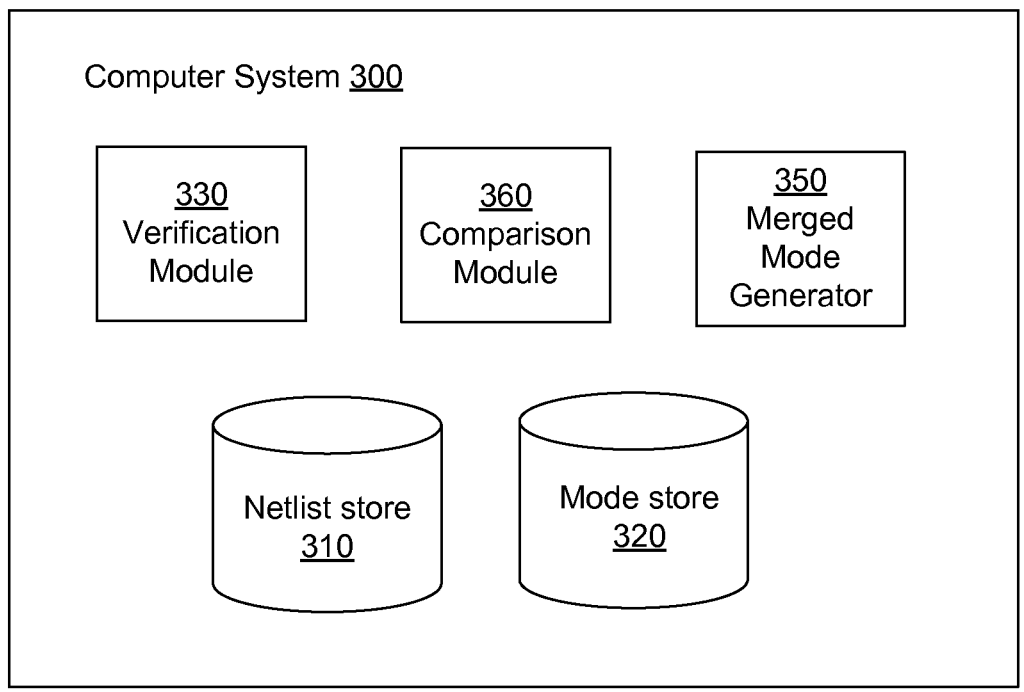
FIG. 3 illustrates an embodiment of the system architecture for automatic verification and generation of merged modes based on individual modes.

FIG. 3 illustrates an embodiment of the system architecture for automatic verification and generation of merged modes based on individual modes. The computer architecture illustrated in FIG. 3 comprises a computer system 300 comprising a verification module 330, a merged mode generator 350, a comparison module 360, a netlist store 310 and a mode store 320. The netlist store 310 stores the netlists of the circuit configuration being analyzed. The mode store 320 stores the information describing the individual modes as well as the merged mode being processed. The verification module 330 performs automatic verification of the merged mode constraints to determine whether the merged mode is equivalent to the individual modes. The merged mode generator 350 performs automatic generation of the merged mode from a set of individual modes. The comparison module 360 performs three passes to match timing relationships between merged modes and the individual modes. The comparison process of the comparison module 360 is invoked by the verification module 330 to perform verification of merged modes and by the merged mode generator 350 to perform generation of merged modes. The system architecture presented in FIG. 3 is used for performing automatic verification and generation of merged modes.

Comparison of Merged Modes with Individual Modes

The comparison module 360 ensures that every timing relationship present in any individual mode 130 is present in the merged mode 120 and every timing relationship present in the merged mode 120 is present in at least one of the individual modes 130. If the comparison module 360 identifies any timing relationship that does not satisfy this criteria, the comparison module 360 flags the timing relationship as a mismatch.

Figure 4:
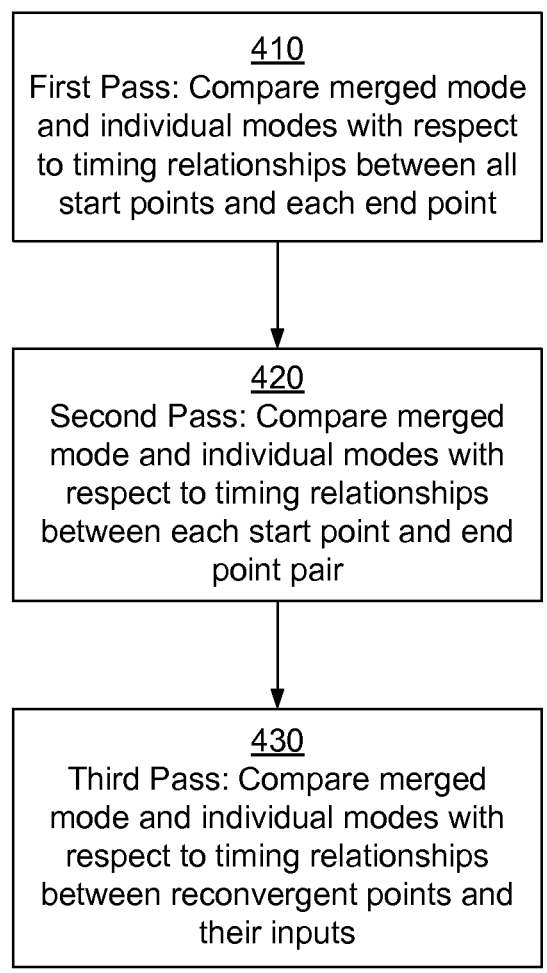
FIG. 4 shows a process illustrating how a merged mode is compared with individual modes with respect to different sets of start points and end points, in accordance with an embodiment.

FIG. 4 illustrates how comparison between a merged mode and individual modes is performed by the comparison module 360 for different sets of start points and end points. As illustrated in FIG. 4, three different passes are performed by the comparison module 360. In the first pass 410, the comparison module 360 compares the merged mode 120 with the individual modes 130 with respect to timing relationships between all start points and a particular end point based on the process illustrated in FIG. 4. The comparison module 360 repeats this process for each end point. If the comparison process determines a mismatch, the comparison module 360 flags the mismatch. The mismatch may be processed manually by a system administrator or by an automatic process. The processing performed when a mismatch is encountered can be used for different purposes, for example, for generation of merged modes or verification of merged modes. If no mismatch is found for an end point and a match cannot be determined decisively due to ambiguities after the first pass 410, the comparison module 360 performs the second pass 420 with respect to the selected end point. Methods and systems for comparing timing constraints between two circuit configurations are disclosed in the U.S. application Ser. No. 12/759,625, filed Apr. 13, 2010, which is incorporated by reference in its entirety.

In the second pass 420, the comparison module 360 compares the merged mode 120 with the individual modes 130 with respect to timing relationships between a particular start point and a particular end point based on the process illustrated in FIG. 4. The comparison module 360 repeats this process for each pair of a start point and an end point. If a mismatch is found, the comparison module 360 flags the mismatch for the pair of start point and end point. If no mismatch is found for a start point and end point pair and a match cannot be determined decisively due to ambiguities after the second pass 420, the comparison module 360 performs the third pass 430 with respect to the selected start point and end point pair.

In the third pass 430, the comparison module 360 compares the merged mode 120 and the individual modes 130 with respect to timing relationships associated with a reconvergent point between the selected start point and end point pair. The comparison module 360 compares timing relationships associated with a timing node with an edge into the reconvergent point and the reconvergent point. If a mismatch is found, the comparison module 360 flags the mismatch for the timing relationship associated with timing node feeding into the reconvergent point and the reconvergent point. If no mismatch is found for timing nodes feeding into this reconvergent point, the process is repeated for other reconvergent points between the selected start point and end point pair. If no mismatch is found for any reconvergent point between the start point and end point pair, the timing relationships associated with the start point and end point pair are determined to be equivalent and the comparison module 360 continues processing other start point and end point pairs.

Embodiments can perform a subset of the steps shown in FIG. 4. For example, an embodiment can perform the first pass 410 without performing the second pass 420 and the third pass 430, if there is no ambiguity found by the first pass 410 (in case of matches as well as mismatches determined by the first pass 410.) Similarly, an embodiment can perform the first pass 410 and the second pass 420, without performing the third pass 430.

Figure 5:
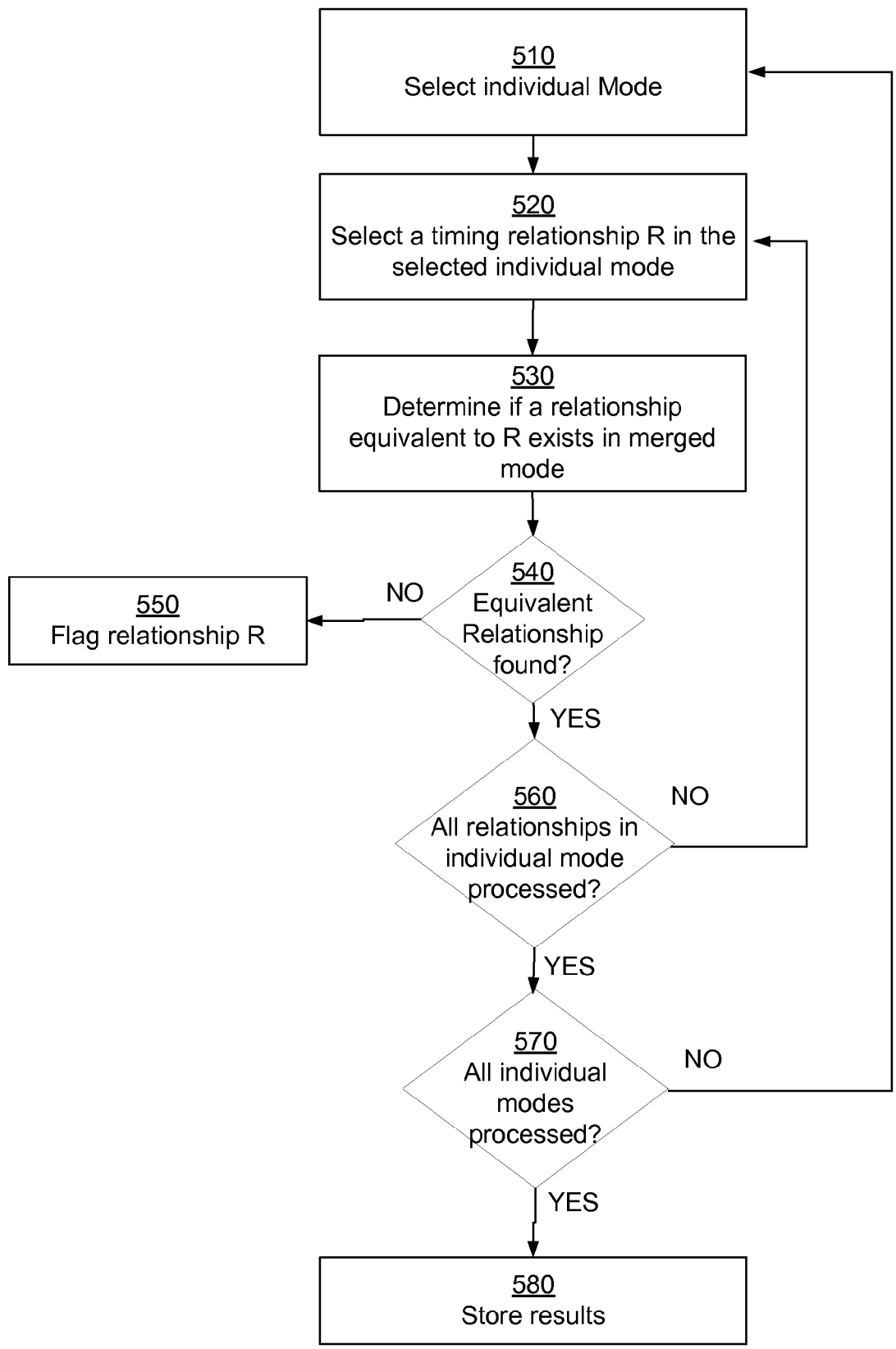
FIG. 5 illustrates the steps for verifying whether each relationship present in every individual mode is present in the merged mode, in accordance with an embodiment.

FIG. 5 illustrates the steps for determining whether each relationship present in every individual mode is present in the merged mode, in accordance with an embodiment. The comparison module 360 selects 510 an individual mode for processing. The comparison module 360 selects 520 a timing relationship R in the selected individual mode 130. The comparison module 360 determines 530 if there is a timing relationship in the merged mode 120 that is equivalent to the selected timing relationship R. If an equivalent relationship is not found 540, the timing relationship R is flagged 550 as a mismatch. If an equivalent relationship is found 540, the comparison module 360 checks 560 whether all timing relationships in the selected individual mode 130 are processes. If there are more timing relationships in the individual mode 130 to be processed, the comparison module 360 selects 520 another timing relationship in the individual mode 130 and repeats the above steps. If all the timing relationships of the selected individual mode 130 are processed, the comparison module 360 checks 570 if there are more individual modes 130 to be processed. If the comparison module 360 finds an individual mode 130 to be processed, the comparison module 360 selects 510 the individual mode and performs the above steps for the individual mode 130. If the comparison module 360 determines that all the individual modes 130 are processed, the comparison module 360 stores 580 the results from the above analysis. In an embodiment, the comparison module 360 stores the results as the above steps are processed.

Figure 6:
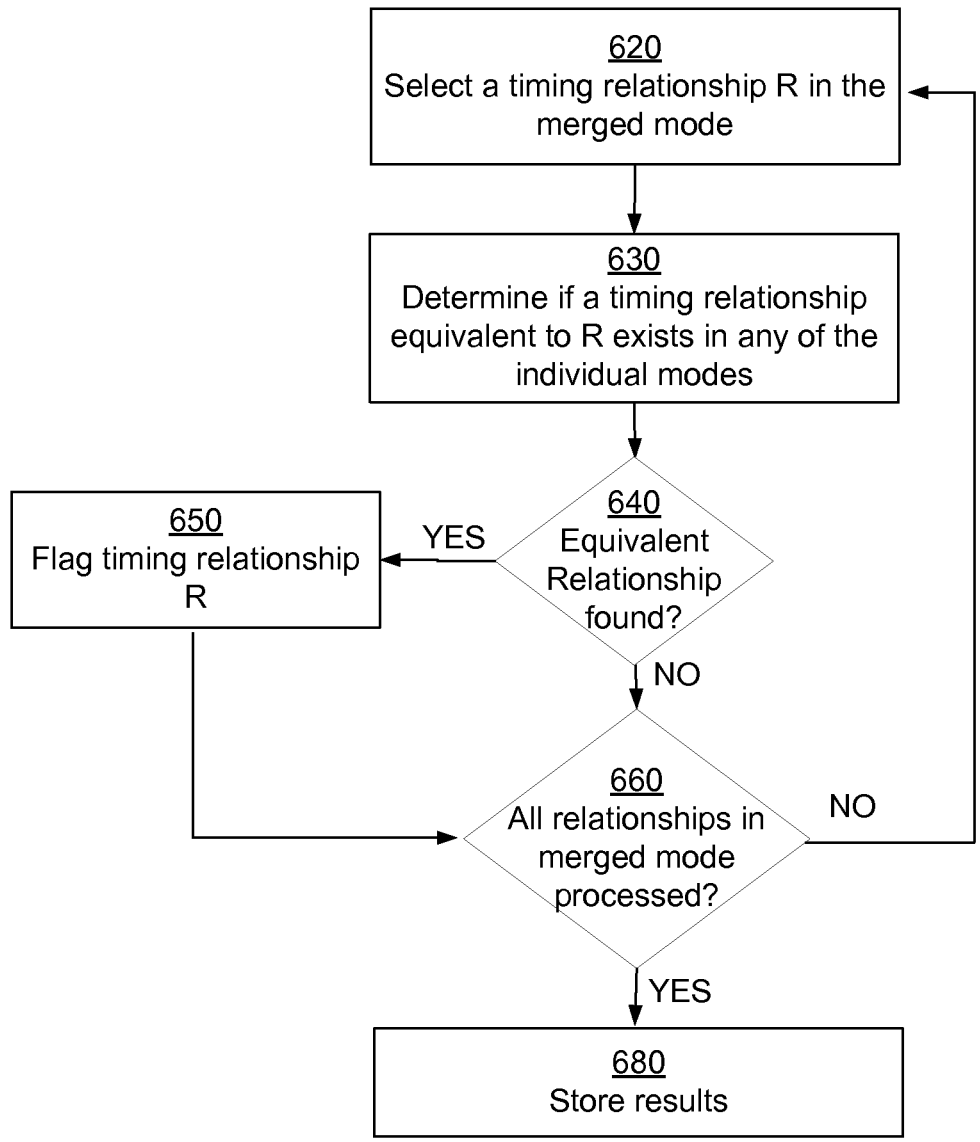
FIG. 6 illustrates the steps for verifying whether each timing relationship present in the merged mode is present in at least one of the individual modes, in accordance with an embodiment.

FIG. 6 illustrates the steps for determining whether each timing relationship present in the merged mode is present in at least one of the individual modes, in accordance with an embodiment. The comparison module 360 selects 620 a timing relationship in the merged mode 120 for processing. The comparison module 360 determines if a timing relationship equivalent to the selected relationship exists in any one of the individual modes 130. If the comparison module 360 does not find 640 an equivalent timing relation in any individual mode, the comparison module 360 flags 650 the selected timing relationship as a mismatch for further analysis. If the comparison module 360 finds an equivalent timing relationship in at least one of the individual modes 130, the selected relationship is not flagged as a mismatch. The comparison module 360 checks 660 if all timing relationships in the merged mode have been processed. If more timing relationship in the merged mode needs to be processed, the comparison module 360 selects 620 an unprocessed timing relationship and performs the above steps for the selected timing relationship. If all the timing relationships of the merged mode are processed, the comparison module 360 stores the results of the above analysis. In an embodiment, the comparison module 360 stores the results as the above steps are processed.

Each pass can be described as determining timing relationships associated with a source set of timing nodes and a sink set of timing nodes. For example, the first pass can be described as determining timing relationships associated with the source set comprising all the start points and the sink set comprising a particular end point. Similarly, the second pass can be described as determining timing relationships associated with the source set comprising a particular end point and the sink set comprising a particular start point.

Figure 7A:
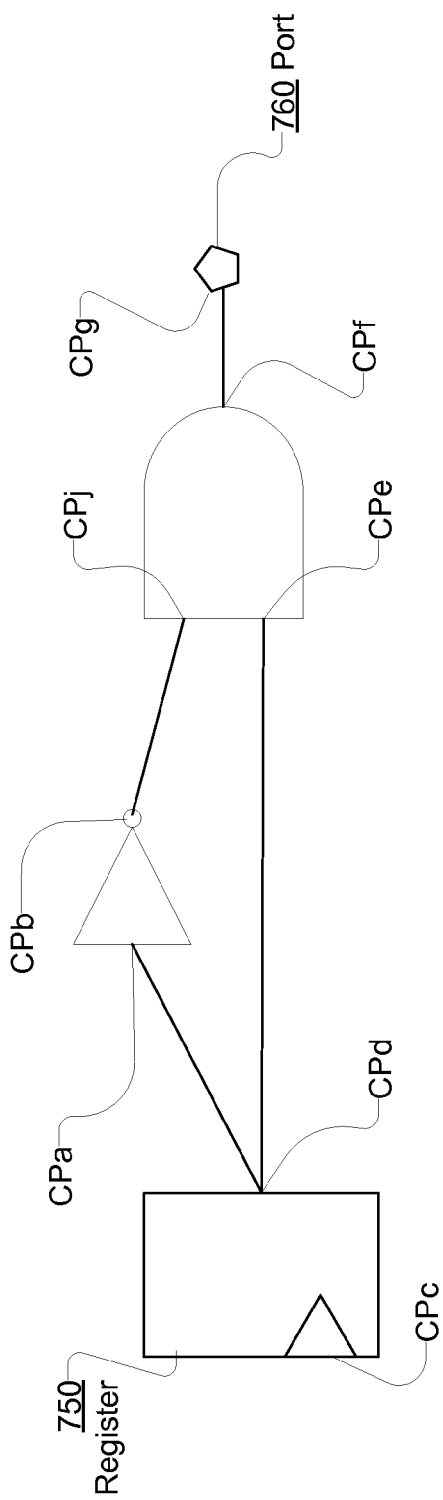
FIG. 7 shows an example circuit configuration illustrating various terms related to a circuit.
Figure 7B:
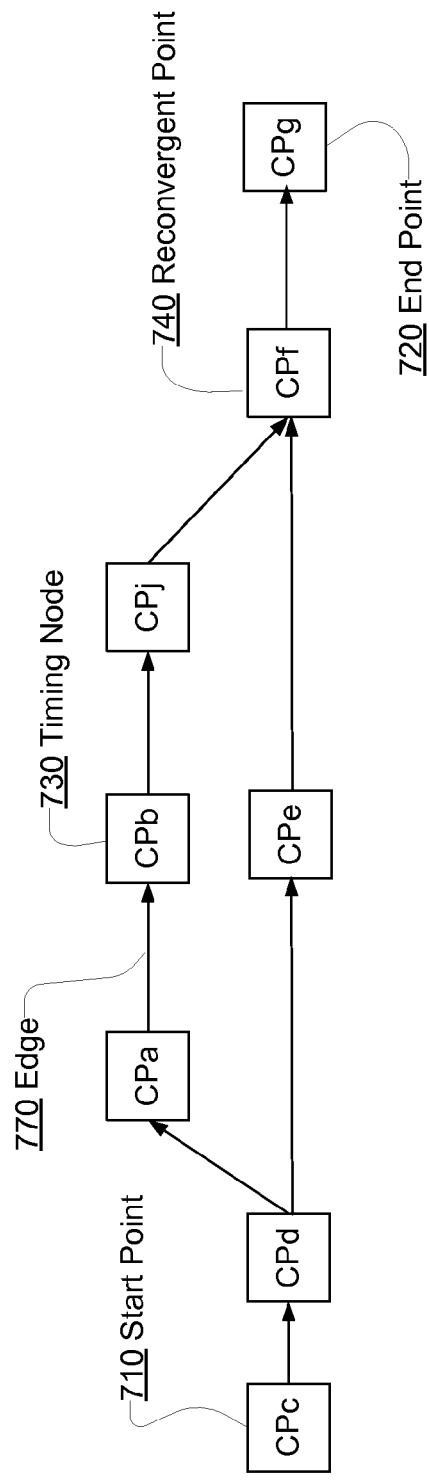

Next we illustrate the details of each pass with respect to a graph representation of a circuit. FIG. 7 shows timing paths in an example circuit, which will be used to illustrate various terms and a corresponding graph representation of the circuit. A timing node is a port of the circuit or a pin of a circuit component. For example, a clock pin of a register is a timing node. A timing node where a timing analysis can originate from will be referred to as a start point. A timing node where a timing analysis can terminate at will be referred to as an end point. The netlist shown in FIG. 7(a) is represented as a graph comprising nodes and edges as shown in FIG. 7(b). The nodes in the graph of FIG. 7(b) are represented by squares and correspond to the timing nodes in the circuit of FIG. 7(a). The edges in FIG. 7(b) are represented by arrows and correspond to FIG. 7(b)'s connections between timing nodes. For example, timing nodes CPa and CPb are connected by an edge whereas timing nodes CPa and CPe do not have an edge between them. If two timing paths between a start point and end point follow different paths and then converge at a timing node, the timing node is called a reconvergent point 740. For example, in FIG. 7(b), the two timing paths between start point CPc and end point CPg diverge at timing node CPd and converge again at timing node CPf. The timing node CPf is called a reconvergent point and the timing node CPd is called a divergent point.

Figure 8A:
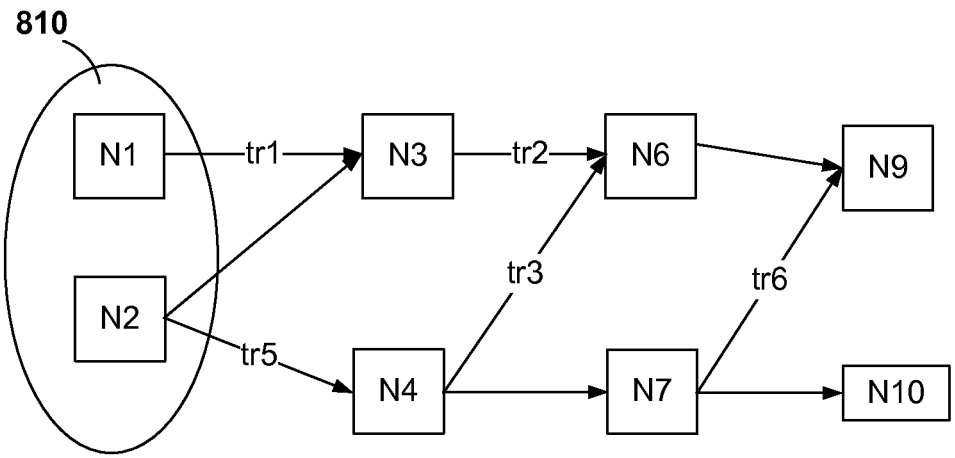
FIGS. 8(a)-(d) illustrate the steps of computation of aggregate constraints at an end point of the circuit with respect to a set of start points, in accordance with an embodiment.

FIGS. 8(a)-(d) illustrate the steps of computation of aggregate timing relationships at an end point of the circuit with respect to a set of start points, in accordance with an embodiment. The various steps shown in FIG. 8 illustrate the computation of the aggregate timing relationships for the circuit starting from an initial set 810 of timing nodes. The timing nodes N1 and N2 are considered the start points for the circuit shown in FIG. 8 and the timing nodes N9 and N10 are the end points of the circuit shown in FIG. 8. The sets of timing relationships for N1 and N2 as shown in FIG. 8(a) are empty since there are no incoming edges to the timing nodes N1 and N2.

Figure 8B:
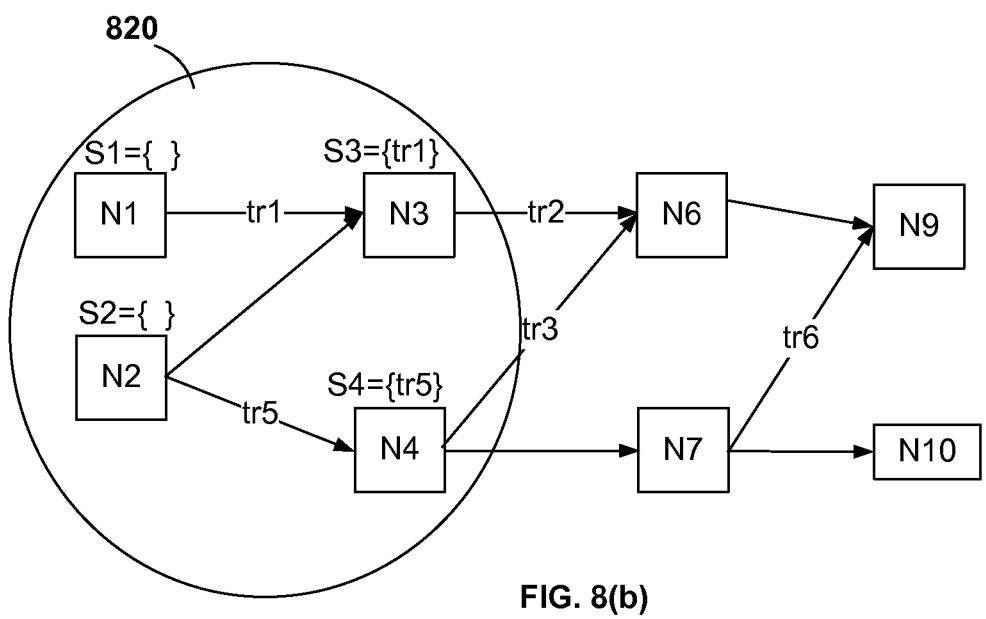

The set of neighboring timing nodes of set 810 includes N3 and N4. The aggregate sets of timing relationships for N3 and N4 are determined as shown in FIG. 8(b). The timing node N4 has a single incoming edge associated with constraint tr4, resulting in the set of timing relationships S4={tr5}. The timing node N3 is a reconvergent point with two incoming edges from timing nodes N1 and N2. The edge from N2 to N3 is not associated with any constraint. Therefore the set of timing relationships for timing node N3 is S3={tr1}. The timing nodes N3 and N4 are added to the set 810 resulting in the set 820 as the current set of timing nodes.

Figure 8C:
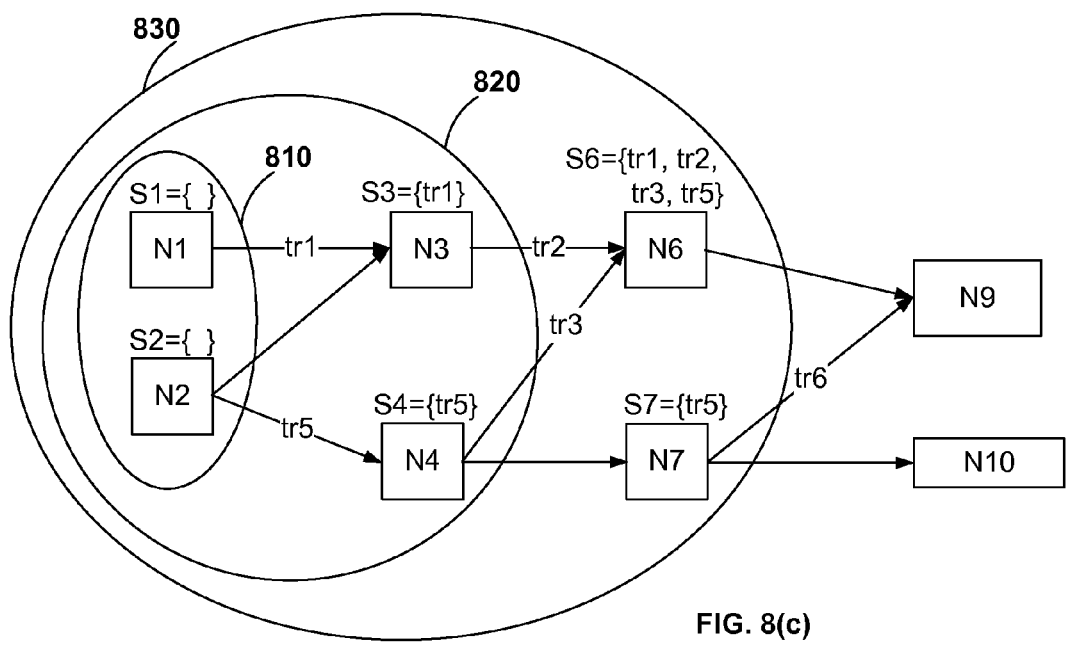
Figure 8D:
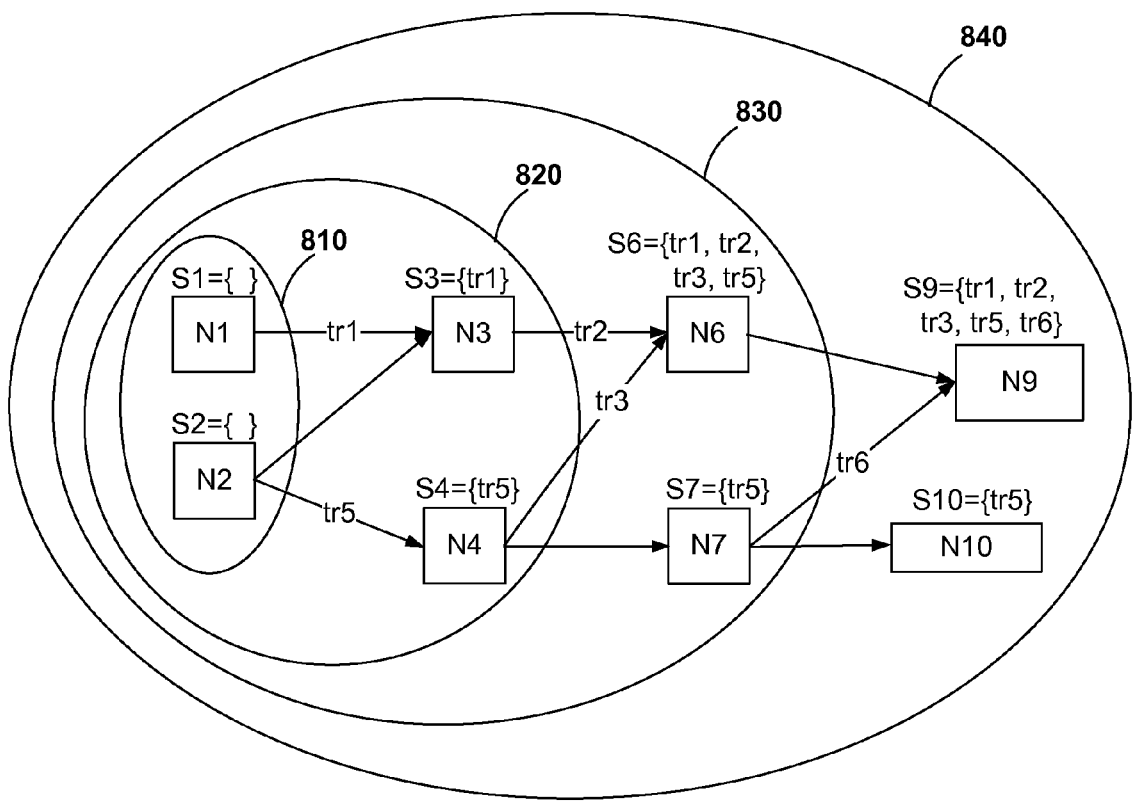

As illustrated in FIG. 8(c) the neighboring timing nodes of the set 820 are N6 and N7. Next the aggregate sets of timing relationships for N6 and N7 are determined. The aggregate set S6 of timing relationships for the reconvergent point N6, includes the timing relationships in set S3, set S4, and the timing relationships tr2 and tr3 associated with the incoming edges of N6 resulting in S6={tr1,tr2,tr3,tr5}. The aggregate set of timing relationships S7 associated with N7 is determined to be same as S4 since no timing relationships are added by the edge between N4 and N7. The timing nodes N6 and N7 are added to the set 820 to obtain set 830. Similarly, as illustrated in FIG. 8(d), the remaining timing nodes are processed. The timing nodes N9 and N10 are the end points of the circuit.

Figure 9A:
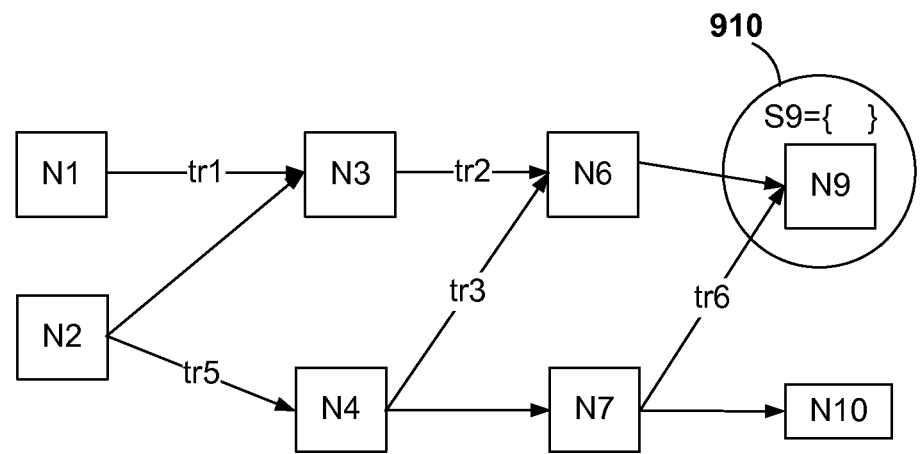
FIGS. 9(a)-(d) illustrate the steps of computation of aggregate constraints at a start point of the circuit with respect to an end point of the circuit, in accordance with an embodiment.
Figure 9B:
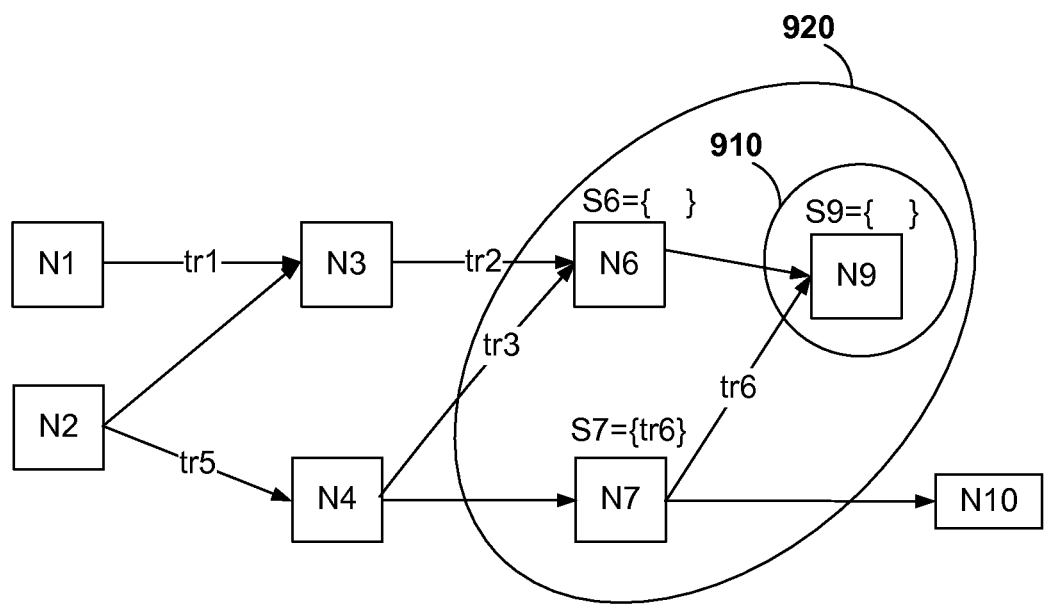
Figure 9C:
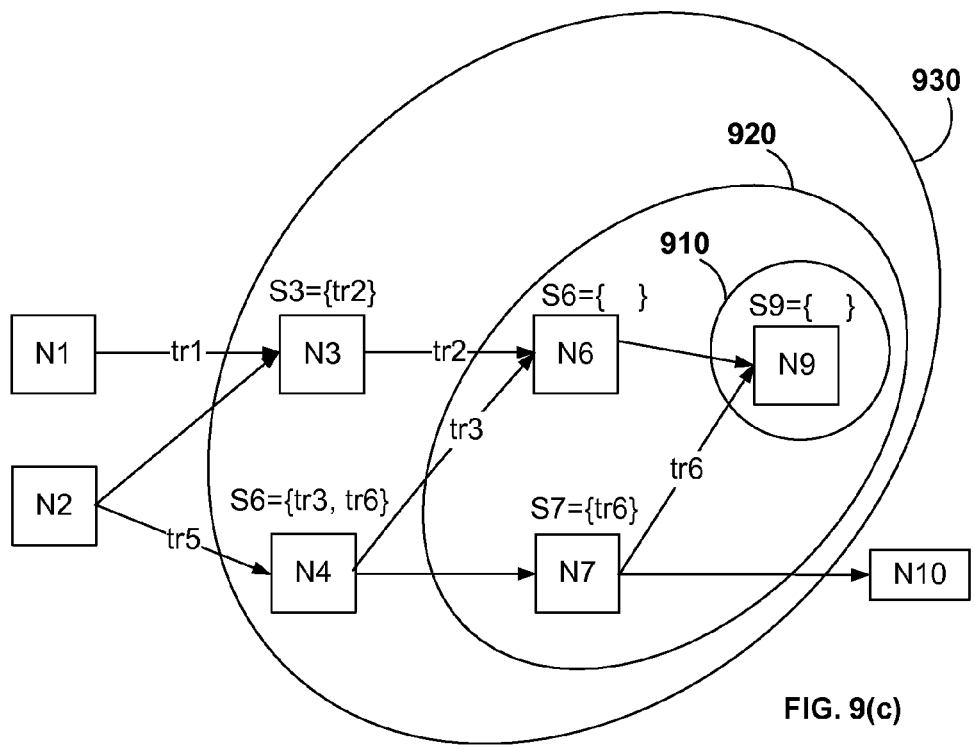
Figure 9D:
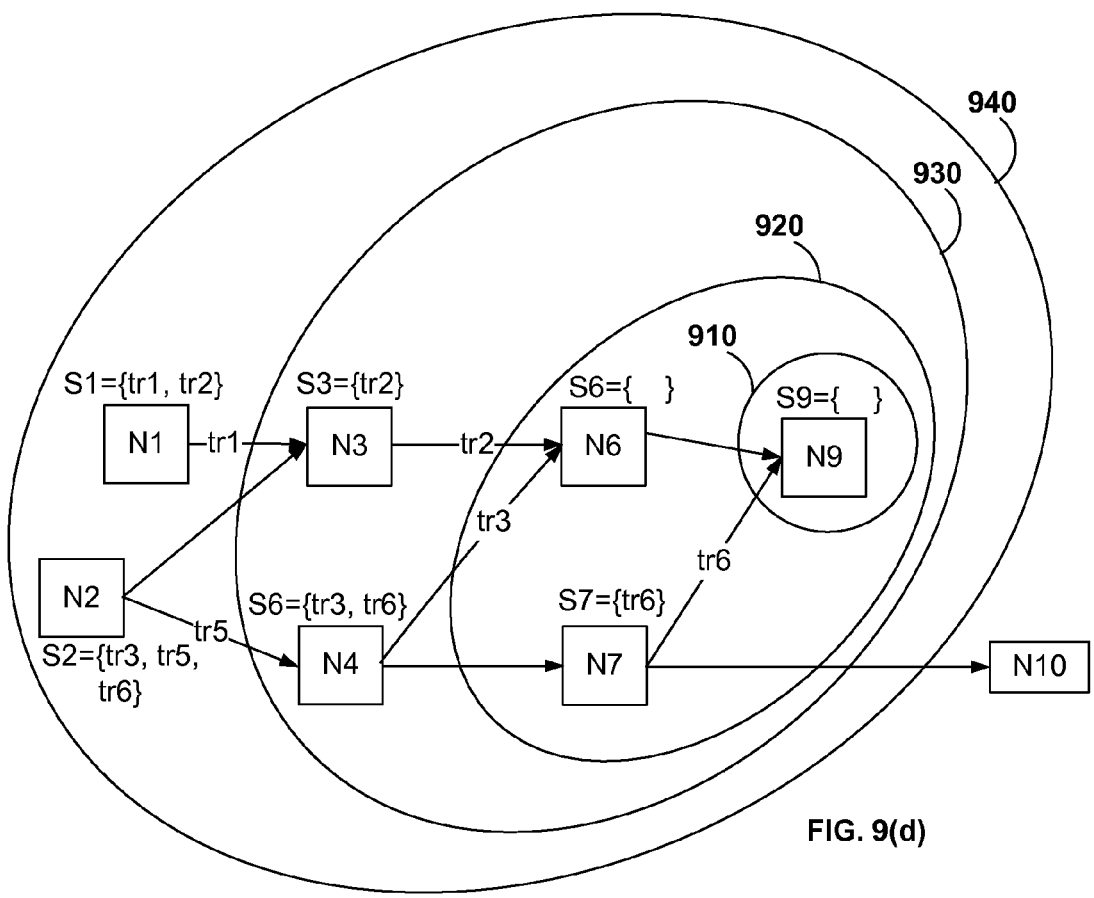

FIGS. 9(a)-(d) illustrate the steps of computation of aggregate timing relationships at a start point of the circuit with respect to an end point of the circuit, in accordance with an embodiment. The computation in the second pass is similar to the first pass except that the source set of timing nodes is a particular end point, the sink set is a particular start point and the direction of traversal is in the reverse direction of the edges. As shown in FIG. 9(a), the source set of timing nodes includes a single end point N9. As shown in FIG. 9(b), the neighboring timing nodes of the set 910 include N6 and N7, traversing in the reverse direction of the edges. The aggregate sets of timing relationships for N6 is S6={ }, i.e., empty set since the edge between N6 and N9 is not associated with any constraint. The edge between N7 and N10 is not associated with any constraint but the edge between N7 and N9 is associated with a constraint tr6, resulting in S7={tr6} being added to S7. The timing nodes N6 and N7 are added to the set of timing nodes 910 to obtain set 920. The above process is continued as shown in FIG. 9(c) to determine aggregate sets of timing relationships for timing nodes N3 and N4 since they are neighboring timing nodes for the set 920. The timing node N4 is a divergent point. The timing nodes N3 and N4 are added to the set 920 to obtain set 930. The aggregate sets of timing relationships for the remaining timing nodes can be determined similar to the examples presented above. The final step illustrated in FIG. 9(d) determines the aggregate sets of timing relationships for each start point with respect to the end point N9. The process is repeated for each end point, for example N10.

Figure 10:
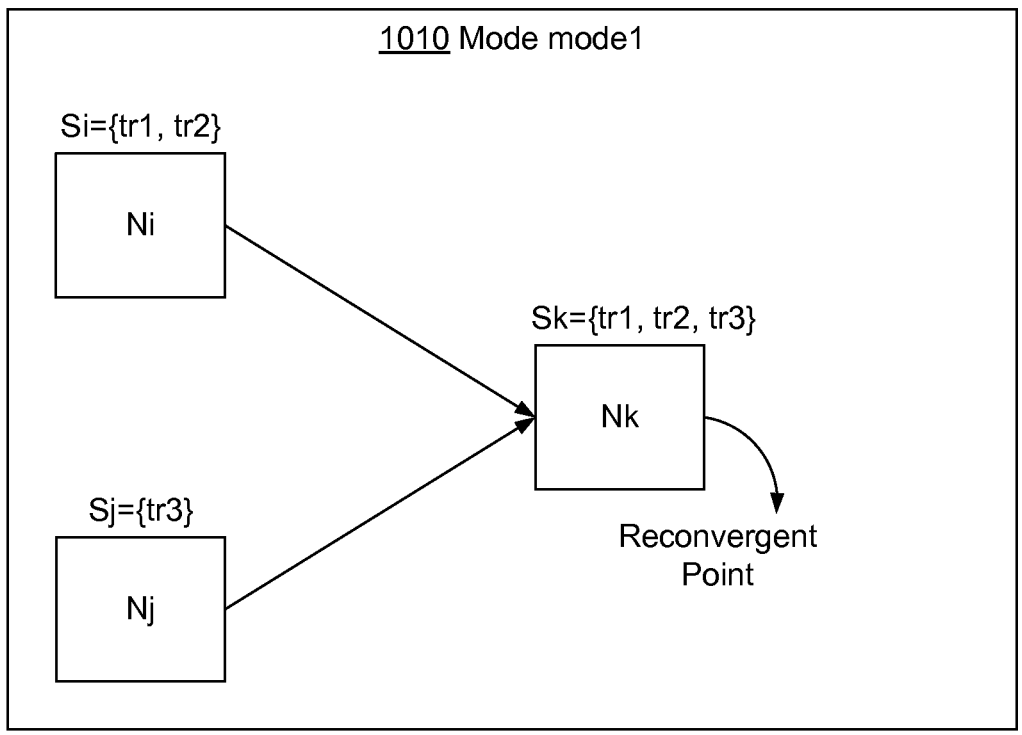
FIG. 10 illustrates the comparison of a reconvergent point in two circuit configurations, in accordance with an embodiment.
Figure 10:
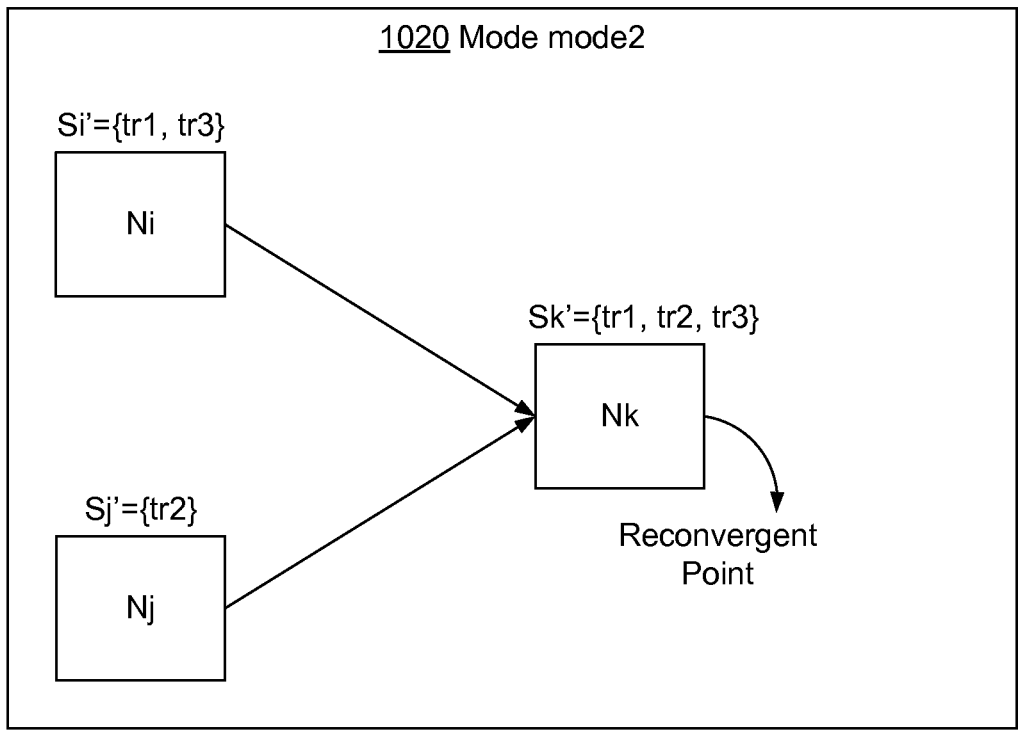

FIG. 10 illustrates how timing relationships associated with reconvergent points from two different modes are compared. As shown in FIG. 10, Nk is a reconvergent point. The aggregate sets of timing relationships Sk and Sk' for the reconvergent point Nk for the two modes have the same elements {tr1, tr2, tr3}. However, if the timing nodes with edges incoming to the reconvergent points are compared, a mismatch can be detected. The aggregate sets of timing relationships for Ni in mode mode1 is Si={tr1,tr2} whereas for mode mode2 it is Si'={tr1,tr3}. Similarly the aggregate sets of timing relationships for the timing node Nj in mode mode1 is Sj={tr3} and in mode mode2 is Sj'={tr2}. Hence a mismatch can be flagged corresponding to the timing nodes feeding into the reconvergent points. The analysis illustrated by FIG. 10 can be applied to a divergent point if the timing paths are traversed in the reverse direction of the edges. Accordingly, timing nodes connected by edges that are out going from the divergent point are compared to identify mismatches.

Generation of Merged Mode

Figure 11:
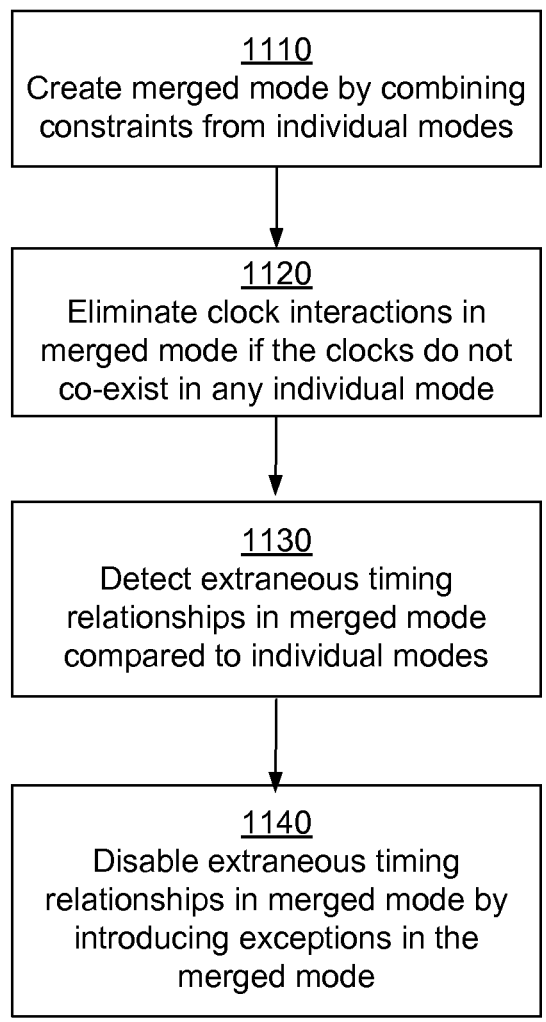
FIG. 11 illustrates the overall process for generating merged mode from individual modes for a netlist, in accordance with an embodiment.

The automatic generation of modes for a set of netlists based on individual modes is described. FIG. 11 illustrates the overall process for generating merged mode from individual modes for a netlist, in accordance with an embodiment. The merged mode generator 350 creates 1110 an initial merged mode based on the constraints of the individual modes for the given netlist. The merged mode generator 350 eliminates 1120 interactions between two clocks in the merged mode if the two clocks never co-exist in any individual mode. The merged mode generator 350 detects 1130 timing relationships in merged mode that are extraneous with respect to the individual modes. In an embodiment, the merged mode generator 350 detects 1130 the extraneous timing relationships by comparing the merged mode with the individual modes, for example, by executing a three pass algorithm based on the flowchart illustrated in FIG. 4.

The merged mode generator 350 disables 1140 these extraneous timing relationships by adding exceptions in the merged mode. The merged mode generator 350 adds exceptions to the merged mode by generating new exceptions in the merged mode or by introducing exceptions from individual modes into the merged mode. The exceptions are added to the merged mode in a manner that ensures that pessimism or optimism does not get added to the merged mode for purposes of signal integrity analysis. An example of pessimism is a merged mode in which there is possibility of crosstalk between two timing nodes even though none of the individual modes allow such crosstalk. An example of optimism is a merged mode in which there is no possibility of crosstalk between two timing nodes even though one or more individual modes allow such crosstalk.

Figure 12:
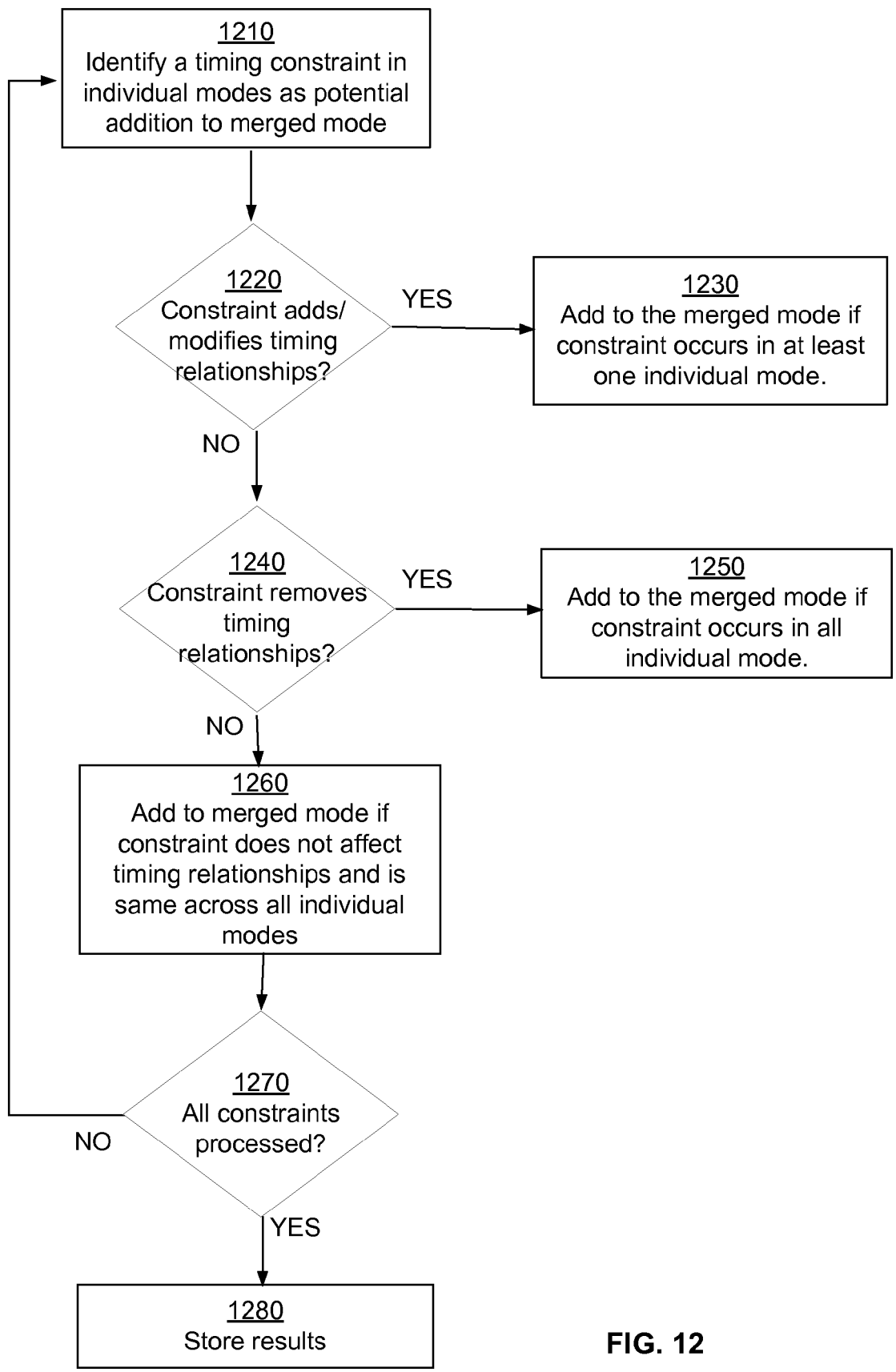
FIG. 12 illustrates how constraints of a merged mode are determined from constraints of individual modes based on their impact on timing relationships, in accordance with an embodiment.

FIG. 12 shows the details of step 1110 illustrating how timing constraints of an initial merged mode are determined from timing constraints of individual modes based on their impact on timing relationships, in accordance with an embodiment. The merged mode generator 350 identifies 1210 a timing constraint in individual modes for determining whether the constraint should be added to the merged mode. The merged mode generator 350 checks 1220 if the timing constraint adds or modifies timing relationships. If the timing constraint adds or modifies timing relationships, the constraint is added to the merged mode if the timing constraint occurs in at least one individual mode. In other words, a union set computed over all individual modes of timing constraints that add/modify timing relationships is added to the merged mode. Examples of timing constraints that add timing relationships include timing constraints that create a clock, timing constraints that set input delay, timing constraints that set maximum delay and the like. For example, a command "create clock" creates a new clock for the netlist and thereby introduces new timing relationships between timing nodes where the clock reaches. A command "set_input_delay" specifies the minimum and maximum amount of delay from a clock edge to the arrival of a signal at a specified input port. A "set_output_delay" command specifies the minimum and maximum amount of delay between the output port and the external sequential device that captures data from that output port. Similarly the commands like set_max_delay and set_min_delay set the maximum and minimum delay constraints for paths. These commands are examples of timing constraints that add timing relationships. An example of a timing constraint that modifies timing relationships is set_multicycle_path that specifies the number of clock cycles required to propagate data from a start point to an end point. In sum, a timing constraint that adds/modifies timing relationships is included in the merged mode if the timing constraint is present in any one of the individual modes.

The merged mode generator 350 further checks 1240 if the timing constraint removes timing relationships. If the timing constraint removes timing relationships, the constraint is added to the merged mode if the timing constraint occurs in all individual modes. In other words, an intersection set computed over all individual modes of timing constraints that remove timing relationships is added to the merged mode. Examples of timing constraints that remove timing relationships include timing constraints that set false path, timing constraints that disable timing, timing constraints that set constant values at pins or ports, set clock groups and the like. For example, the set_false_path timing constraint excludes a path from timing analysis and therefore removes timing relationships along the specified paths. The set_disable_timing command disables a timing edge and thereby prevents timing analysis through the edge and removes timing relationships associated with the edge. The set_case_analysis command sets the data at a pin or port to a constant value, thereby reducing the interactions between the pin/port and other timing nodes. The set_clock_groups constraint can be used to specify exclusivity between clocks, thereby reducing the timing interactions between the clocks. These timing constraints remove timing relationships from a mode. A timing constraint that removes timing relationships is included in the merged mode if the timing constraint is present in all the individual modes.

In an embodiment, if all individual modes have a constant value of either 0 or 1 specified at a pin/port, such that at least one individual mode specifies a value of one for that pin/port and at least one individual mode specifies a value of zero for that pin/port, a timing constraint is added to the merged mode that specifies that the value on the pin/port is constant, for example, "set_case_analysis constant port_name." The information that the pin/port always has a constant value indicates that there are no timing relationships associated with this timing node since the signal on the timing node never changes during any mode of operation.

If the timing constraint does not affect timing relationships, the merged mode generator 350 adds 1260 the timing constraint to the merged mode if the timing constraint is the same across all the individual modes. In an embodiment, the merged mode generator 350 returns error if a timing constraint that does not affect timing relationships does not occur across all individual modes or is not the same across all the individual modes. If the merged mode generator 350 determines 1270 that more timing constraints of the individual modes need to be processed, the merged mode generator 350 identifies 1210 another timing constraint and processes it, or else, the merged mode generator 350 stores 1280 the results. The results can be stored after or during other steps of the process illustrated in FIG. 12.

Figure 13A:
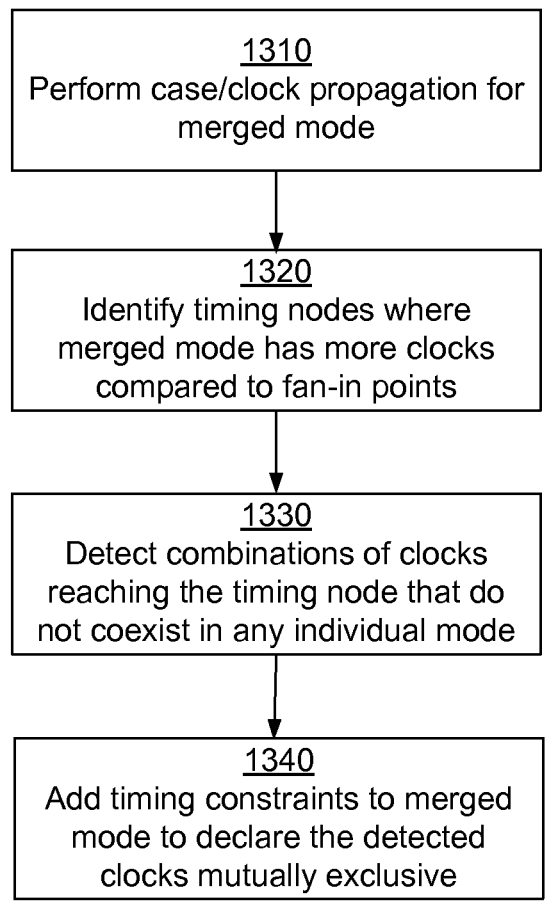
FIG. 13(a) illustrates the process for eliminating timing relationships between clocks in the merged mode that do not co-exist in any individual mode, in accordance with an embodiment.
Figure 13B:
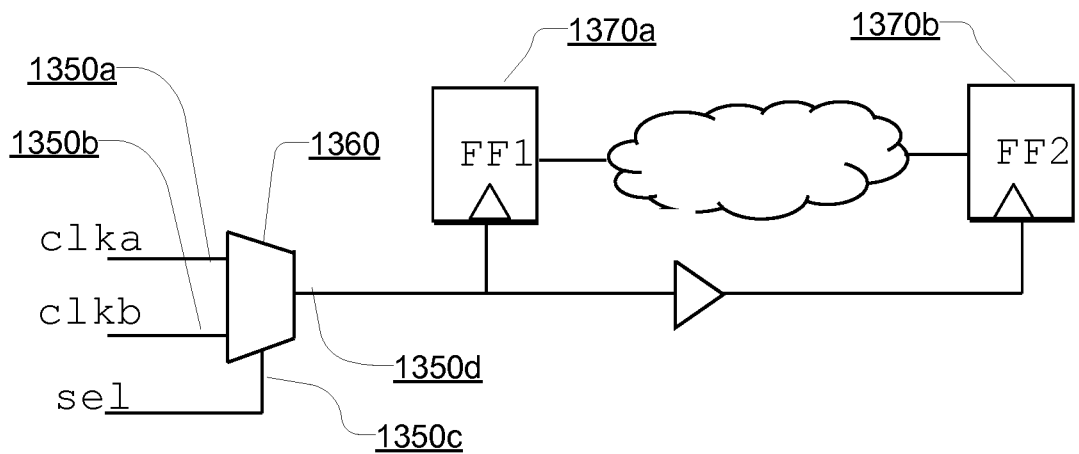
FIG. 13(b) shows a circuit diagram to illustrate the process of elimination of timing relationships based on the flowchart shown in FIG. 13(a), in accordance with an embodiment.

Next, FIG. 13(*a*) illustrates the process for eliminating 1120 timing relationships between clocks in the merged mode. The merged mode generator 350 eliminates 1120 interactions between clocks in the merged mode if the clocks do not co-exist in any individual mode with respect to a set of timing nodes. The merged mode generator 350 performs propagation 1310 of clock inputs or case inputs that specify a constant value at a pin/port. The merged mode generator 350 identifies timing nodes where merged mode has more clocks compared to fan-in points. The merged mode generator 350 detects combinations of clocks that reach the timing node but do not coexist in any individual mode. The merged mode generator 350 adds timing constraints to the merged mode to declare these clocks as mutually exclusive.

For example, if multiple individual modes are combined to a merged mode and clock clka is disabled in all individual modes in which clkb is enabled and clkb is disabled in all individual modes in which clka is enabled, the merged mode generator 350 determines that clka and clkb cannot coexist in any individual mode. Accordingly, the merged mode generator 350 eliminates the interactions between clocks clka and clkb in the merged mode by introducing appropriate constraints, for example, a constraint that specifies that clka and clkb are exclusive (logically or physically).

FIG. 13(*b*) shows a circuit diagram to illustrate the process of elimination of timing relationships based on the flowchart shown in FIG. 13(*a*), in accordance with an embodiment. The timing nodes 1350*a* and 1350*b* correspond to pins receiving clocks clka and clkb as inputs respectively. The input pin 1350*c* provides an input sel which allows selection of one of the inputs of the multiplexer 1360. The selected clock input reaches the output 1350*d* of the multiplexer 1360 and is provided as the input clock for the flip-flops 1370*a* and 1370*b*. There can be two individual modes, mode1 and mode2. Assume that in mode1 the input at timing node 1350*c* (sel) is set to a constant value 1, thereby selecting the clock clka at the input pin 1350*a* for the multiplexer 1360. This can be specified using a timing constraint "set_case_analysis 1 [get_ports sel]" in mode1. In mode2 the value for timing node 1350*c* (sel) value is set to a constant 0, thereby selecting the clock clkb at the input pin 1350*b* for the multiplexer 1360. This can be specified using a timing constraint "set_case_analysis 0 [get_ports_sel]"

The merged mode contains both the create_generated_clock timing constraints described above, since these constraints add timing relationship and are added to the merged mode in step 1220, 1230 of the flowchart in FIG. 12. However, in any individual mode, only one clock input reaches the timing node 1350*d* and the clocks do not co-exist in any individual modes. Therefore, a timing constraint is added 1340 to disable any interactions between the two clocks by declaring the two clocks as mutually exclusive, for example, "set_clock_groups—physically_exclusive—group clka—group clkb." The set_clock_groups command defines groups of clocks that are mutually exclusive with respect to each other. Specifying the two clocks clka and clkb to be physically exclusive indicates that there is no need to perform any crosstalk analysis between the clock nets. Therefore, any timing analysis performed using the merged mode does not check paths that start from a clock in one group (say clka) and end at a clock in another group (say clkb).

Figure 14:
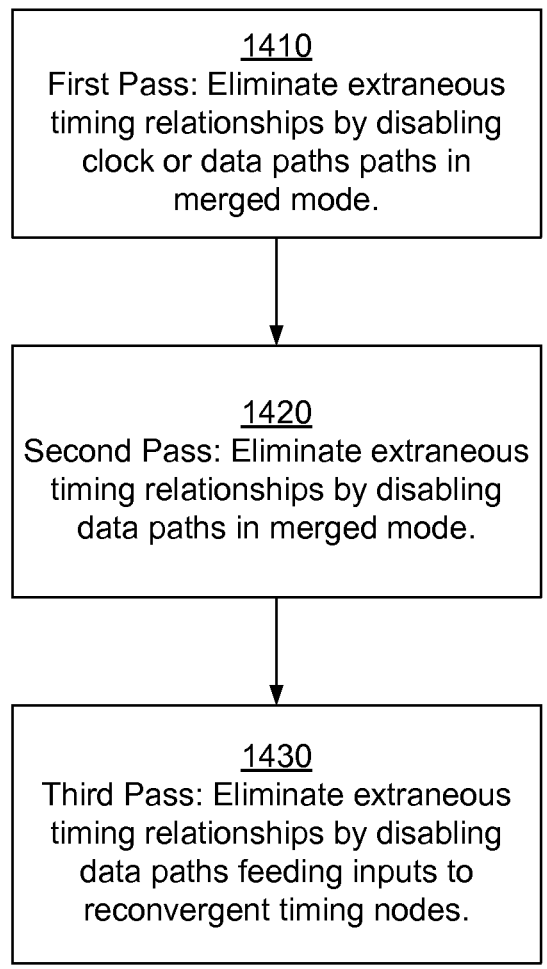
FIG. 14 shows the flowchart for illustrating the steps for detecting and eliminating extraneous timing relationships in a merged mode, in accordance with an embodiment.

Next, the steps of detection 1130 of extraneous timing relationships in merged mode for disabling 1140 the timing relationships is described in detail. FIG. 14 shows the flowchart for illustrating the steps for detecting and eliminating extraneous timing relationships in a merged mode, in accordance with an embodiment. The flowchart shown in FIG. 14 performs three passes similar to the flowchart illustrated in FIG. 4. The first pass eliminates 1410 extraneous timing relationships from the merged mode by disabling clock paths that reach a timing node in the merged mode but do not reach the same timing node in any individual mode. The second pass eliminates 1420 extraneous timing relationships by disabling data paths in merged modes if a timing relationship is present between two timing nodes but there is no corresponding timing relationship between the timing nodes in any individual modes. The third pass eliminates 1430 extraneous relationships by disabling data paths feeding inputs to reconvergent timing nodes. The details of the three passes are further described herein.

Figure 15A:
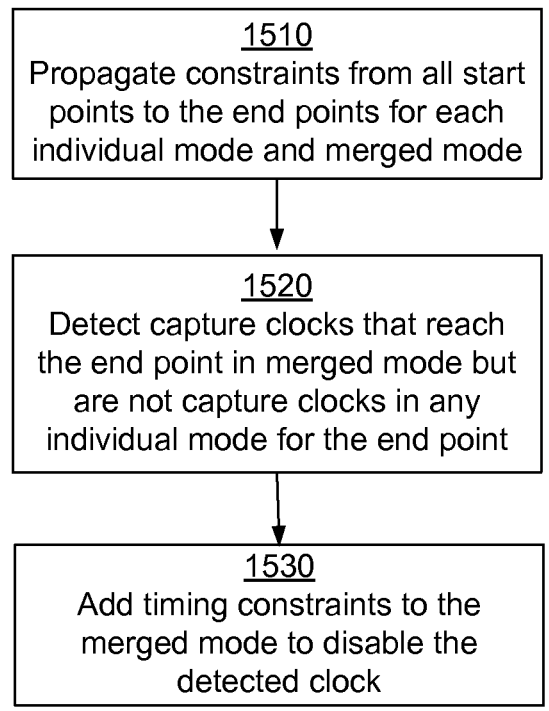
FIG. 15(a) illustrates the details of the first pass for eliminating extraneous timing relationships from the merged mode by disabling clock paths, in accordance with an embodiment.
Figure 15B:
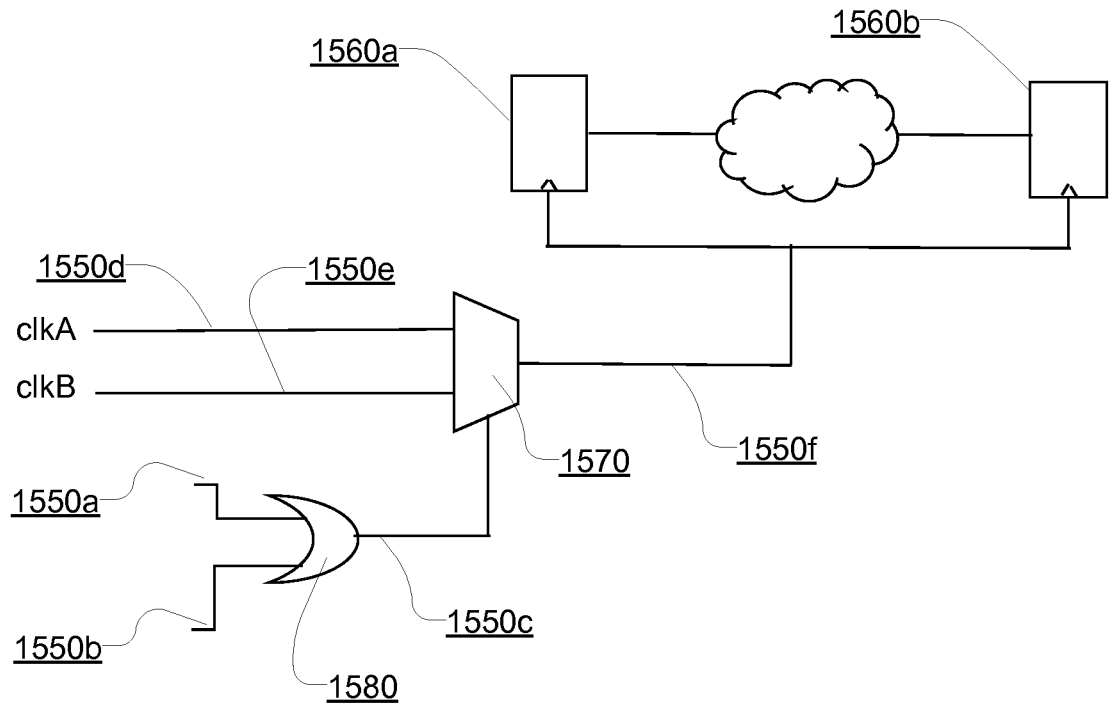
FIG. 15(b) shows a circuit diagram to illustrate the process of elimination of extraneous timing relationships from the merged mode based on the flowchart shown in FIG. 15(a).

FIG. 15(*a*) illustrates the details of the first pass 1410 for eliminating extraneous timing relationships from the merged mode by disabling clock paths, in accordance with an embodiment. The merged mode generator 350 propagates the constraints from all start points to an end point for each individual mode and the merged mode. This step is performed in the manner illustrated by example in FIG. 8. The merged mode generator 350 analyzes the aggregated timing relationships for the end point to identify capture clocks that reach the end point in the merged mode and individual modes. In particular, the merged mode generator 350 detects 1520 capture clocks that reach the end point in the merged mode but are not capture clocks in any individual mode for that end point. The merged mode generator 350 adds timing constraints to the merged mode to disable the clock path from reaching the timing node. For example, a clock clk1 can be disabled by adding a constraint "set_clock_sense—stop_propagation—clock clk1 pin_name." In an embodiment, an intermediate timing node connecting the clock input to the end point is selected for disabling the clock path. The steps illustrated in FIG. 15 are repeated for all end points.

FIG. 15(*b*) illustrates the process of FIG. 15(*a*) by an example. The inputs 1550*a* and 1550*b* are provided to an OR gate 1580. There are two individual modes modeA and modeB associated with the netlist shown in FIG. 15. In modeA, the input 1550*a* is set to constant value 1 and 1550*b* is set to a constant value 0. In modeB, the input 1550*a* is set to a constant value 0 and 1550*b* is set to a constant value 1. As a result, the output 1550*c* of the gate 1580 is determined to be 1 in modeA as well as modeB. The value at timing node 1550*c* corresponds to the select input value for the multiplexer 1570. Accordingly, only the clock input clkA on pin 1550*e* reaches the output 1550*f* of the multiplexer 1570 for the individual modes. The clkB input on pin 1550*d* never reaches the output 1550*f* of the multiplexer 1570 for the modes modeA and modeB. The output 1550*f* of the multiplexer 1570 acts as the clocks for the flip-flops 1560*a* and 1560*b*. Accordingly, in none of the individual modes, modeA and modeB, the clock input clkA at pin 1550*d* reaches the end points corresponding to the flip-flops 1560*a* and 1560*b*. Therefore, the clock clkA is disabled in the merged mode by adding 1530 a timing constraint, for example, "set_clock_sense—stop_propagation—clock clkA [get_pin mux1/Z]" wherein mux1 corresponds to the multiplexer 1570 and the pin returned by "get_pin mux1/Z" corresponds to the timing node 1550*f*.

Figure 16A:
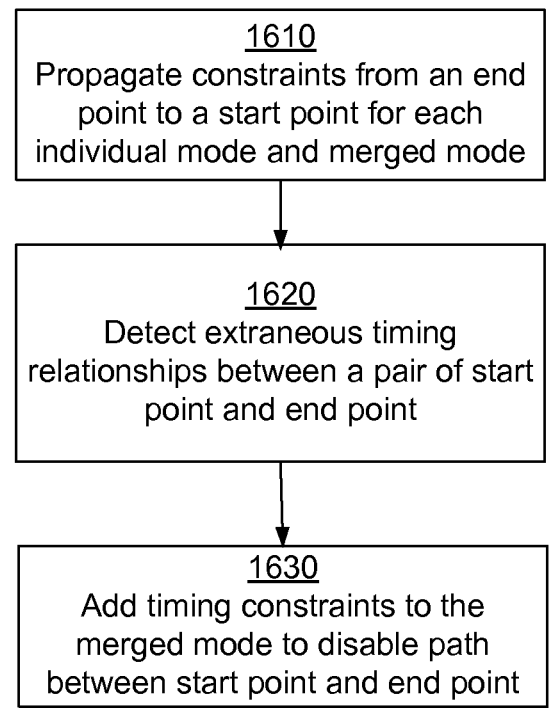
FIG. 16(a) illustrates the details of the second pass for eliminating extraneous timing relationships by disabling data paths in merged modes, in accordance with an embodiment.
Figure 16B:
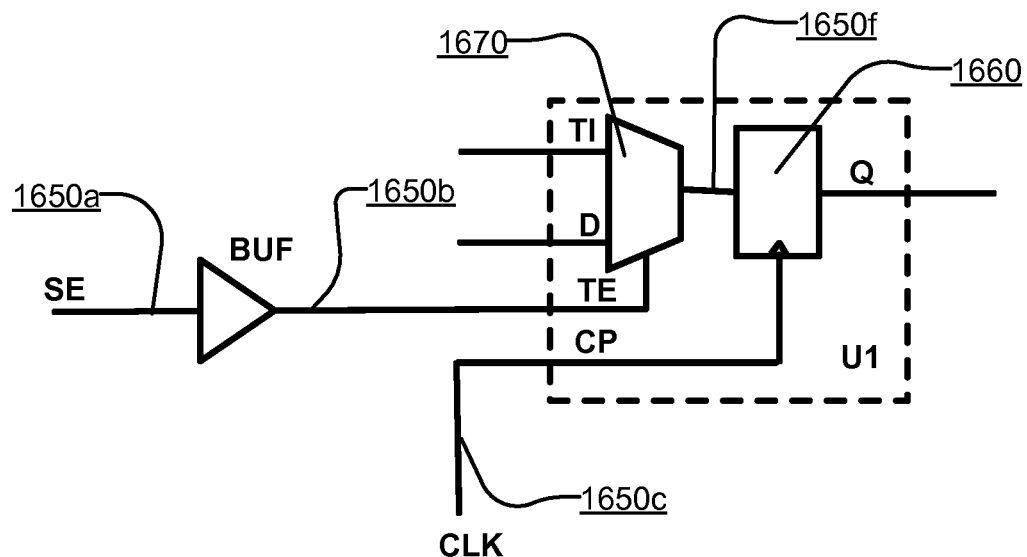
FIG. 16(b) shows a circuit diagram to illustrate the process of elimination of extraneous timing relationships from the merged mode based on the flowchart shown in FIG. 16(a).

FIG. 16(*a*) illustrates the details of the second pass 1420 for eliminating extraneous timing relationships by disabling data paths in merged modes, in accordance with an embodiment. The merged mode generator 350 propagates 1610 the timing relationships from an end point to a start point as illustrated in FIG. 9. The merged mode generator 350 detects 1620 extraneous timing relationships between a pair of start point and end point and adds 1630 timing constraints to the merged mode to disable extraneous paths between the start point and end point. The steps illustrated in FIG. 16(*a*) are repeated for all start points that can reach an end point, and for each end point that couldn't be resolved in pass1 alone.

FIG. 16(*b*) illustrates the process of FIG. 16(*a*) by an example. Assume there are two individual modes modeX and modeY for the netlists shown in FIG. 16(*b*). The input SE provided via pin 1650*a* reaches the output 1650*b* of the buffer BUF and is provided as an input to the multiplexer 1670. The mode modeX specifies the input SE to the pin 1650*a* to be constant 0, for example, by specifying "set_case_analysis 0 [get_port SE]." The mode modeY specifies the input SE to the pin 1650*a* to be constant 1, for example, by specifying "set_case_analysis 1 [get_port SE]." These two timing constraints are of the type that remove timing relationships since specifying a constant value for a pin ensures that there are no timing relationships associated with the pin. Therefore, these timing constraints can be added to the initial merged mode only if they are the same across all individual modes. However, since these timing constraints are not the same for modeX and modeY, these are not added to the merged mode. Accordingly extraneous timing relationships of data paths that start from the input SE and reach timing nodes associated with the flip-flop 1660 are disabled by adding appropriate timing constraints to the merged mode. For example, a timing constraint "set_false_path—from SE" can be added to the merged mode to disable paths from input 1650*a* (port SE) to the end point associated with the timing node 1650*f* (input of flip-flop 1660).

Figure 17A:
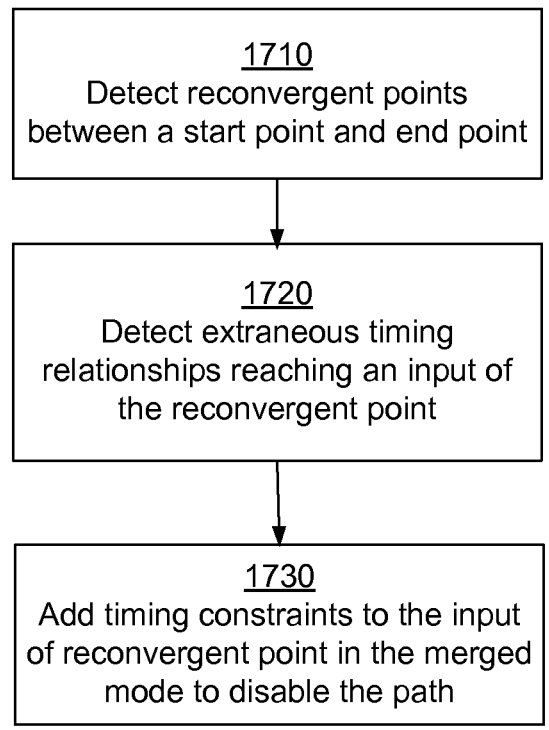
FIG. 17(a) illustrates the details of the third pass for eliminating extraneous timing relationships by disabling data paths feeding inputs to reconvergent timing nodes, in accordance with an embodiment.
Figure 17B:
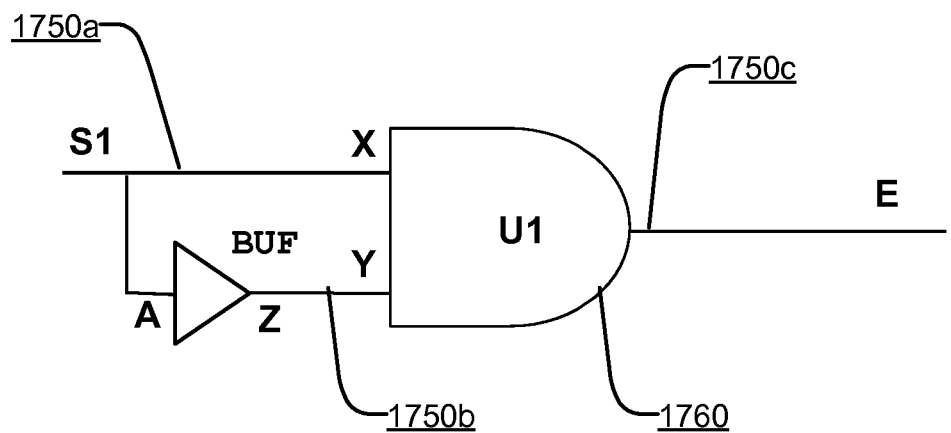
FIG. 17(b) shows a circuit diagram to illustrate the process of elimination of extraneous timing relationships from the merged mode based on the flowchart shown in FIG. 17(a).

FIG. 17 illustrates the details of the third pass 1430 for eliminating extraneous timing relationships in merged mode by disabling data paths feeding inputs to reconvergent timing nodes, in accordance with an embodiment. The merged mode generator 350 detects 1710 reconvergent points between a start point and an end point. This check is performed if there are multiple timing relationships between a start point and end point pair caused by reconvergent points between the start point and end point. For example, FIG. 17(*b*) shows an example netlist with a reconvergent point 1750*c*. The gate 1760 has two inputs, 1750*a* and 1750*b*. The input 1750*a* is provided as input A to the buffer BUF and the output Z of the buffer BUF is fed in input 1750*b* to the gate 1760. Assume there are two individual modes, modeP and modeQ for the circuit in FIG. 17(*b*). The individual mode modeP specifies a timing constraint "set_false_path—through [get_pin BUF/A]." The individual mode modeQ specifies a timing constraint "set_false_path—through [get_pin BUF/Z]." Accordingly, the input to the gate 1760 via the timing node 1750*b* is set to false path in both individual modes. Two timing relationships are detected at the reconvergent point 1750*c*, one associated with input X of the gate 1760 and another associated with input Y of the gate 1760.

Since there are multiple timing relationships reaching the reconvergent point 1750*c*, the appropriate timing relationships are not eliminated in pass 1 (illustrated in FIG. 15) and pass 2 (illustrated in FIG. 16). However, each input of the reconvergent point is compared between the merged mode and the individual modes to determine if a path can be disabled. In FIG. 17(*b*), the merged mode generator 350 determines that in both the individual modes modeP and modeQ, the input Y received at timing node 1750*b* is disabled. Accordingly a timing constraint is added 1730 to the merged mode to disable the path arriving at the input Y of gate 1760, for example, "set_false_path—through [get_pin U1/Y]."

Verification of Merged Modes

Figure 18:
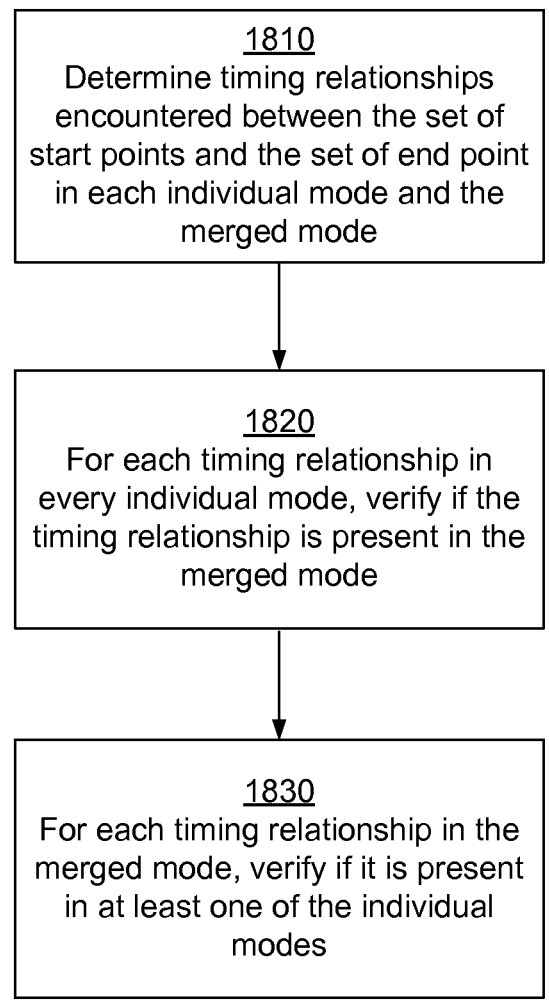
FIG. 18 illustrates an embodiment of the overall process for verifying equivalence between a merged mode and individual modes corresponding to a netlist.

FIG. 18 illustrates an embodiment of the overall process for verifying equivalence between a merged mode and individual modes corresponding to a netlist. The verification module 330 performs the steps illustrated in the flowchart of FIG. 18 to verify the equivalence between the merged mode and the individual modes with respect to a set of start points and a set of end points of the circuit configuration.

The verification module 330 determines 1810 the timing relationships encountered between the set of start points and the set of end points in each individual modes 130 as well as the merged mode 120. In an embodiment, the determination of the timing relationships comprises aggregating timing relationships by performing a graph traversal from the set of start points to the set of end points as described herein. The verification module 330 verifies 1820 whether a timing relationship present in an individual mode 130 is present in the merged mode 120. If a timing relationship is present in an individual mode 130 but no equivalent timing relationship is found in the merged mode 120, the timing relationship is flagged as a mismatch. A mismatch can be flagged by logging a message or by presenting a message to a user. A timing relationship from one mode is equivalent to a timing relationship from another mode if the two timing relationships are associated with the same pair of timing nodes and have equivalent launching clock and capture clock as well as equivalent state as defined by the associated timing constraints. A mismatch found between the merged mode and an individual mode can be further analyzed automatically or by a system administrator.

The verification module 330 verifies 1830 for each timing relationship in the merged mode 120, whether there is an equivalent timing relationship in at least one of the individual modes 130. If a timing relationship is present in the merged mode 120 but there is no equivalent timing relationship in any of the individual modes 130, the verification module 330 flags the timing relationship as a mismatch. This timing relationship can be further analyzed automatically or by a system administrator.

Accordingly, the verification module 330 ensures that every timing relationship present in any individual mode 130 is present in the merged mode 120 and every timing relationship present in the merged mode 120 is present in at least one of the individual modes 130. If the verification module 330 identifies any timing relationship that does not satisfy this criteria, the verification module 330 flags the timing relationship as a mismatch.

Figure 19:
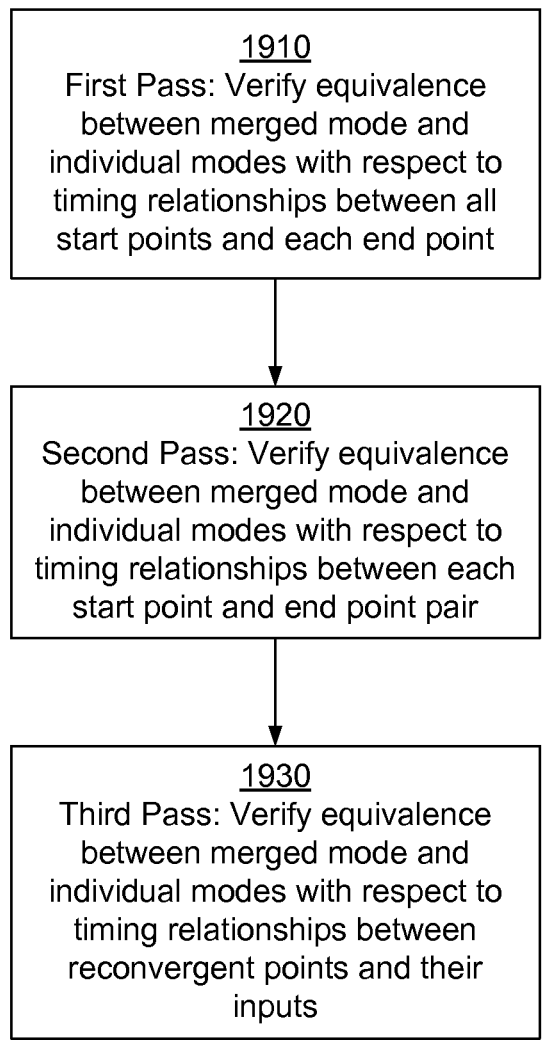
FIG. 19 illustrates how the timing verification between a merged mode and individual modes is performed for different sets of start points and end points, in accordance with an embodiment.

The verification process can be performed using the three pass process illustrated in FIG. 19 which is similar to the three pass process illustrated in FIG. 4. The three passes can be performed by the verification module 330 by invoking the comparison module 360. In the first pass 1910, the verification module 330 verifies the equivalence between the merged mode 120 with the individual modes 130 with respect to timing relationships between all start points and a particular end point based on the process illustrated in FIG. 18. The verification module 330 repeats this process for each end point. If the verification process determines a mismatch, the verification module 330 flags the mismatch. The mismatch may be fixed manually by a system administrator or by an automatic process. If no mismatch is found for an end point and a match cannot be determined decisively due to ambiguities after the first pass 1910, the verification module 330 performs the second pass 1920 with respect to the selected end point.

In the second pass 1920, the verification module 330 verifies the equivalence between the merged mode 120 with the individual modes 130 with respect to timing relationships between a particular start point and a particular end point based on the process illustrated in FIG. 18. The verification module 330 repeats this process for each pair of a start point and an end point. If a mismatch is found, the verification module 330 flags the mismatch for the pair of start point and end point. The step 1920 is repeated for each start point with respect to the selected end point. If no mismatch is found for a start point and end point pair and a match cannot be determined decisively due to ambiguities after the second pass 1920, the verification module 330 performs the third pass 1930 with respect to the selected start point and end point pair.

In the third pass 1930, the verification module 330 verifies the equivalence between the merged mode 120 and the individual modes 130 with respect to timing relationships associated with a reconvergent point between the selected start point and end point pair. The verification module 330 verifies equivalence for timing relationships associated with a timing node with an edge into the reconvergent point and the reconvergent point. If a mismatch is found, the verification module 330 flags the mismatch for the timing relationship associated with timing node feeding into the reconvergent point and the reconvergent point. If no mismatch is found for timing nodes feeding into this reconvergent point, the process is repeated for other reconvergent points between the selected start point and end point pair. If no mismatch is found for any reconvergent point between the start point and end point pair, the timing relationships associated with the start point and end point pair are determined to be equivalent and the verification module 330 continues processing other start point and end point pairs.

Embodiments can perform a subset of the steps shown in FIG. 19. For example, an embodiment can perform the first pass 1910 without performing the second pass 1920 and the third pass 1930, if there is no ambiguity found by the first pass 1910 (in case of matches as well as mismatches determined by the first pass 1910.) Similarly, an embodiment can perform the first pass 1910 and the second pass 1920, without performing the third pass 1930.

If the steps 1910, 1920, 1930 find no mismatch, the verification module 330 determines the merged mode 120 to be equivalent to the individual modes 130. In an embodiment, any mismatches found are flagged. The mismatches can be fixed via an automatic process or by a system administrator by modifying the merged mode 120. The above verification process can be repeated for the modified merged mode 120 to determine if the modified merged mode 120 is equivalent to the individual modes 130.

A process similar to that illustrated in FIG. 5 can be used for verifying whether each relationship present in every individual mode is present in the merged mode. Similarly, a process similar to that illustrated in FIG. 6 can be used for verifying whether each timing relationship present in the merged mode is present in at least one of the individual modes. Accordingly the verification process can be performed to determine if a merged mode is equivalent to several individual modes.

In sum, embodiments allow efficient generation of merged modes from individual modes for a set of netlists and verification of equivalence between merged mode and individual modes for the set of netlists. Timing constraints are added to the merged mode in a manner that does not add pessimism to the merged mode. Errors are reported during merging if necessary identifying timing nodes causing errors. The merged mode generated is determined with high accuracy and confidence and can be used for implementation stages of design as well as sign-off stages.

Computer Architecture

Figure 20:
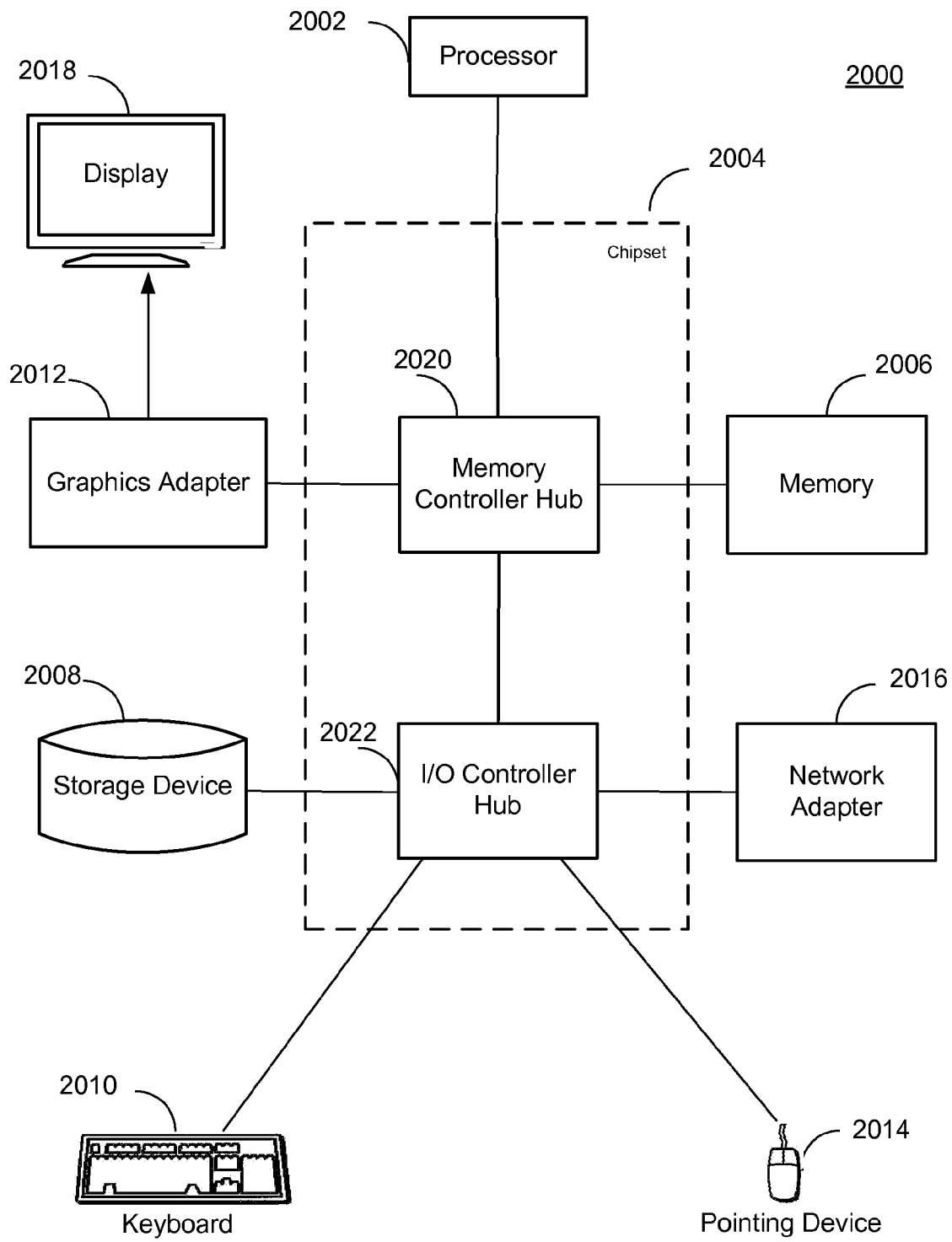
FIG. 20 is a high-level block diagram illustrating an example of a computer for use in generation or verification of merged modes with individual modes, in accordance with an embodiment.

FIG. 20 is a high-level block diagram illustrating an example computer 2000 that can be used for processing the steps of the processes described herein. The computer 2000 includes at least one processor 2002 coupled to a chipset 2004. The chipset 2004 includes a memory controller hub 2020 and an input/output (I/O) controller hub 2022. A memory 2006 and a graphics adapter 2012 are coupled to the memory controller hub 2020, and a display 2018 is coupled to the graphics adapter 2012. A storage device 2008, keyboard 2010, pointing device 2014, and network adapter 2016 are coupled to the I/O controller hub 2022. Other embodiments of the computer 2000 have different architectures.

The storage device 2008 is a non-transitory computer-readable storage medium such as a hard drive, compact disk read-only memory (CD-ROM), DVD, or a solid-state memory device. The memory 2006 holds instructions and data used by the processor 2002. The pointing device 2014 is a mouse, track ball, or other type of pointing device, and is used in combination with the keyboard 2010 to input data into the computer system 2000. The graphics adapter 2012 displays images and other information on the display 2018. The network adapter 2016 couples the computer system 2000 to one or more computer networks.

The computer 2000 is adapted to execute computer program modules for providing functionality described herein. As used herein, the term "module" refers to computer program logic used to provide the specified functionality. Thus, a module can be implemented in hardware, firmware, and/or software. In one embodiment, program modules are stored on the storage device 2008, loaded into the memory 2006, and executed by the processor 2002. The types of computers 2000 used can vary depending upon the embodiment and requirements. For example, a computer may lack displays, keyboards, and/or other devices shown in FIG. 20.

Some portions of above description describe the embodiments in terms of algorithmic processes or operations. These algorithmic descriptions and representations are commonly used by those skilled in the data processing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality. The described operations and their associated modules may be embodied in software, firmware, hardware, or any combinations thereof.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a system and a process for performing verification of merged mode with respect to one or more individual modes associated with the merged mode. Thus, while particular embodiments and applications have been illustrated and described, it is to be understood that the present invention is not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A computer-implemented method for verifying equivalence between a merged mode for a circuit and a plurality of individual modes for the circuit, the method comprising:

identifying, by a computer, a source set of timing nodes and a sink set of timing nodes in a set of netlists, the sink set comprising a reconvergent node on at least two timing paths from a start point to an end point, and the source set comprising a timing node on one of the timing paths, the timing node connected to the reconvergent node by an edge, wherein a merged mode and a plurality of individual modes are defined for the netlists, the merged mode and the individual modes comprising timing constraints for netlists in the set of netlists;

identifying, by the computer, timing relationships for each individual mode and the merged mode, each timing relationship comprising a first timing node, a second timing node, and one or more timing constraints for a timing path from the first timing node to the second timing node;

determining, by the computer, an aggregate set of timing relationships encountered by traversing from the source set of timing nodes to the sink set of timing nodes for each individual mode and the merged mode;

comparing, by the computer, timing relationships in the aggregate set from the merged mode with timing relationships in aggregate sets from each of the individual modes to identify a mismatch between the merged mode and the plurality of individual modes, the comparing comprising:

identifying a timing relationship present in the aggregate set from the merged mode such that the timing relationship is absent in all of the aggregate sets from the individual modes;

responsive to identifying a mismatch between timing relationships in the aggregate set from the merged mode and timing relationships in aggregate sets from the individual modes, determining that the merged mode is not equivalent to the plurality of individual modes; and sending information indicating the merged mode is not equivalent to the plurality of individual modes.

2. The computer-implemented method of claim 1, wherein identifying the mismatch comprises identifying a timing relationship present in an aggregate set from an individual mode, such that the timing relationship is absent in the aggregate set from the merged mode.

3. The computer-implemented method of claim 1, wherein:
the sink set consists of a single end point; and
the source set consists of a plurality of start points with at least a timing path from the timing node in the source set to the single end point.

4. The computer-implemented method of claim 1, wherein:
the source set consists of a single end point; and
the sink set consists of a single start point, the single start point having a timing path to the single end point.

5. The computer-implemented method of claim 1, wherein the comparing comprises:
verifying for each timing relationship in the merged mode whether there is an equivalent timing relationship in at least one of the individual modes; and
verifying that for each of the plurality of individual modes, if a timing relationship is present in the individual mode, there is an equivalent timing relationship in the merged mode.

6. The computer-implemented method of claim 1, wherein the sink set is a first sink set consisting of a single end point and the source set is a first source set consisting of a plurality of start points with at least a timing path from the timing node in the source set to the single end point, further comprising:
responsive to identifying no mismatch using the first source set and the first sink set, identifying a second source set consisting of the single end point and a second sink set consisting of a single start point, the single start point having a timing path to the single end point; and
repeating the steps of identifying timing relationships, determining aggregate set, and comparing timing relationships for the second source set and the second sink set.

7. The computer-implemented method of claim 6, further comprising:
responsive to identifying no mismatch using the second source set and the second sink set, identifying a third sink set consisting of a reconvergent node on at least two timing paths from a start point to an end point and a third source set consisting of a timing node on one of the timing paths, the timing node connected to the reconvergent node by an edge; and
repeating the steps of identifying timing relationships, determining aggregate set, and comparing timing relationships for the third source set and the third sink set.

8. A computer-implemented system for performing verification of equivalence of a merged mode for a circuit and a plurality of individual modes for the circuit, the system comprising:
a computer processor; and
a computer-readable storage medium storing computer program modules configured to execute on the computer processor, the computer program modules comprising:
a verification module configured to:
identify a source set of timing nodes and a sink set of timing nodes in a set of netlists, the sink set comprising a reconvergent node on at least two timing paths from a start point to an end point, and the source set comprising a timing node on one of the timing paths, the timing node connected to the reconvergent node by an edge, wherein a merged mode and a plurality of individual modes are defined for the netlists, the merged mode and the individual modes comprising timing constraints for netlists in the set of netlists;
identify timing relationships for each individual mode and the merged mode, each timing relationship comprising a first timing node, a second timing node, and one or more timing constraints for a timing path from the first timing node to the second timing node;
determine an aggregate set of timing relationships encountered by traversing from the source set of timing nodes to the sink set of timing nodes for each individual mode and the merged mode;
compare timing relationships in the aggregate set from the merged mode with timing relationships in aggregate sets from each of the individual modes to identify a mismatch between the merged mode and the plurality of individual modes, the comparing causing the verification module to:
identify a timing relationship present in the aggregate set from the merged mode such that the timing relationship is absent in all of the aggregate sets from the individual modes;
responsive to identifying a mismatch between timing relationships in the aggregate set from the merged mode and timing relationships in aggregate sets from the individual modes, determine that the merged mode is not equivalent to the plurality of individual modes; and
send information indicating the merged mode is not equivalent to the plurality of individual modes.

9. The computer-implemented system of claim 8, wherein identifying the mismatch comprises identifying a timing relationship present in an aggregate set from an individual mode, such that the timing relationship is absent in the aggregate set from the merged mode.

10. The computer-implemented system of claim 8, wherein:
the sink set consists of a single end point; and
the source set consists of a plurality of start points with at least a timing path from the timing node in the source set to the single end point.

11. The computer-implemented system of claim 8, wherein:
the source set consists of a single end point; and
the sink set consists of a single start point, the single start point having a timing path to the single end point.

12. The computer-implemented system of claim 8, wherein the comparing causes the verification module to:
verify for each timing relationship in the merged mode whether there is an equivalent timing relationship in at least one of the individual modes; and
verify that for each of the plurality of individual modes, if a timing relationship is present in the individual mode, there is an equivalent timing relationship in the merged mode.

13. A non-transitory computer readable storage medium storing a computer program product including computer instructions configured to cause a processor of a computer to perform a computer-implemented method for performing verification of equivalence of a merged mode for a circuit and a plurality of individual modes for the circuit, the computer program product comprising:
a verification module configured to:
identify a source set of timing nodes and a sink set of timing nodes in a set of netlists, the sink set comprising a reconvergent node on at least two timing paths from a start point to an end point, and the source set comprising a timing node on one of the timing paths, the timing node connected to the reconvergent node by an edge, wherein a merged mode and a plurality of individual modes are defined for the netlists, the merged mode and the individual modes comprising timing constraints for netlists in the set of netlists;

identify timing relationships for each individual mode and the merged mode, each timing relationship comprising a first timing node, a second timing node, and one or more timing constraints for a timing path from the first timing node to the second timing node;

determine an aggregate set of timing relationships encountered by traversing from the source set of timing nodes to the sink set of timing nodes for each individual mode and the merged mode;

compare timing relationships present in the aggregate set from the merged mode with timing relationships in aggregates sets from each of the individual modes to identify a mismatch between the merged mode and the plurality of individual modes, the comparing causing the verification module to:
  identify a timing relationship present in the aggregate set from the merged mode such that the timing relationship is absent in all of the aggregate sets from the individual modes;

responsive to identifying a mismatch between timing relationships present in the aggregate set from the merged mode and timing relationships in aggregates sets from the individual modes, determine that the merged mode is not equivalent to the plurality of individual modes; and
  send information indicating the merged mode is not equivalent to the plurality of individual modes.

14. The non-transitory computer readable storage medium of claim 13, wherein identifying the mismatch comprises identifying a timing relationship present in an aggregate set from an individual mode, such that the timing relationship is absent in the aggregate set from the merged mode.

15. The non-transitory computer readable storage medium of claim 13, wherein:
  the sink set consists of a single end point; and
  the source set consists of a plurality of start points with at least a timing path from the timing node in the source set to the single end point.

16. The non-transitory computer readable storage medium of claim 13, wherein:
  the source set consists of a single end point; and
  the sink set consists of a single start point, the single start point having a timing path to the single end point.

17. The non-transitory computer readable storage medium of claim 13, wherein the comparing causes the verification module to:
  verify for each timing relationship in the merged mode whether there is an equivalent timing relationship in at least one of the individual modes; and
  verify that for each of the plurality of individual modes, if a timing relationship is present in the individual mode, there is an equivalent timing relationship in the merged mode.

* * * * *

UNITED STATES PATENT AND TRADEMARK OFFICE
CERTIFICATE OF CORRECTION

PATENT NO.       : 8,607,186 B2
APPLICATION NO.  : 13/025075
DATED            : December 10, 2013
INVENTOR(S)      : Subramanyam Sripada et al.

It is certified that error appears in the above-identified patent and that said Letters Patent is hereby corrected as shown below:

In the Claims

Column 21, line 16: after "in" delete "aggregates sets" and replace with --aggregate sets--

Column 21, line 26: after "in" delete "aggregates sets" and replace with --aggregate sets--

Signed and Sealed this
Twenty-third Day of September, 2014

Michelle K. Lee
*Deputy Director of the United States Patent and Trademark Office*